US010256408B2

(12) United States Patent
James et al.

(10) Patent No.: US 10,256,408 B2
(45) Date of Patent: *Apr. 9, 2019

(54) COMPOSITION AND METHOD FOR PREPARATION OF ORGANIC ELECTRONIC DEVICES

(71) Applicant: Merck Patent GmbH, Darmstadt (DE)

(72) Inventors: Mark James, Romsey (GB); Magda Goncalves-Miskiewicz, Southampton (GB); Philip E. May, Sidcup (GB); Lana Nanson, Southampton (GB); Ruth Effenberger, Undenheim (DE); Edgar Kluge, Gross-Gerau (DE)

(73) Assignee: Merck Patent GmbH, Darmstadt (DE)

( * ) Notice: Subject to any disclaimer, the term of this patent is extended or adjusted under 35 U.S.C. 154(b) by 136 days.

This patent is subject to a terminal disclaimer.

(21) Appl. No.: 15/266,532

(22) Filed: Sep. 15, 2016

(65) Prior Publication Data

US 2017/0062725 A1 Mar. 2, 2017

Related U.S. Application Data

(63) Continuation of application No. 13/640,408, filed as application No. PCT/EP2011/001682 on Apr. 5, 2011, now abandoned.

(30) Foreign Application Priority Data

Apr. 12, 2010 (EP) ...................... 10003857

(51) Int. Cl.
| | | |
|---|---|---|
| *H01L 51/00* | (2006.01) | |
| *C08G 61/12* | (2006.01) | |
| *C09D 5/22* | (2006.01) | |
| *C09D 5/24* | (2006.01) | |
| *C09D 165/00* | (2006.01) | |
| *C09K 11/02* | (2006.01) | |
| *C09K 11/06* | (2006.01) | |
| *H01L 51/05* | (2006.01) | |
| *H01L 51/50* | (2006.01) | |
| *H01L 51/42* | (2006.01) | |

(52) U.S. Cl.
CPC ........ *H01L 51/0039* (2013.01); *C08G 61/123* (2013.01); *C08G 61/128* (2013.01); *C09D 5/22* (2013.01); *C09D 5/24* (2013.01); *C09D 165/00* (2013.01); *C09K 11/025* (2013.01); *C09K 11/06* (2013.01); *H01L 51/0007* (2013.01); *H01L 51/0037* (2013.01); *H01L 51/0043* (2013.01); *H01L 51/0056* (2013.01); *H01L 51/0058* (2013.01); *H01L 51/0085* (2013.01); *C08G 2261/124* (2013.01); *C08G 2261/228* (2013.01); *C08G 2261/312* (2013.01); *C08G 2261/314* (2013.01); *C08G 2261/3142* (2013.01); *C08G 2261/3162* (2013.01); *C08G 2261/3223* (2013.01); *C08G 2261/91* (2013.01); *C08G 2261/92* (2013.01); *C08G 2261/95* (2013.01); *C09K 2211/1416* (2013.01); *C09K 2211/1425* (2013.01); *C09K 2211/1433* (2013.01); *C09K 2211/1458* (2013.01); *H01L 51/0003* (2013.01); *H01L 51/0004* (2013.01); *H01L 51/0005* (2013.01); *H01L 51/0035* (2013.01); *H01L 51/0052* (2013.01); *H01L 51/0074* (2013.01); *H01L 51/0094* (2013.01); *H01L 51/0541* (2013.01); *H01L 51/0545* (2013.01); *H01L 51/0566* (2013.01); *H01L 51/4253* (2013.01); *H01L 51/5012* (2013.01); *H01L 51/5016* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | |
|---|---|---|
| 8,278,394 B2 | 10/2012 | Pan et al. |
| 2004/0099882 A1 | 5/2004 | Hokari et al. |
| 2005/0156148 A1 | 7/2005 | Kanbe et al. |
| 2006/0113897 A1 | 6/2006 | Fukase |
| 2006/0208221 A1 | 9/2006 | Gerhard et al. |
| 2007/0153371 A1 | 7/2007 | Cha et al. |
| 2007/0221916 A1 | 9/2007 | Shkunov et al. |

(Continued)

FOREIGN PATENT DOCUMENTS

| | | |
|---|---|---|
| EP | 1083775 A1 | 3/2001 |
| EP | 1950816 A1 | 7/2008 |

(Continued)

OTHER PUBLICATIONS

International Search Report for PCT/EP2011/001681 dated Jul. 14, 2011.

(Continued)

*Primary Examiner* — Lorna M Douyon

(57) ABSTRACT

The present invention relates to novel compositions comprising an organic semiconductor (OSC) and one or more organic solvents. The composition is solid at a temperature of 25° C. and fluid at a higher temperature and the boiling point of the solvent is at most 400° C. Furthermore, the present invention describes the use of these compositions as inks for the preparation of organic electronic (OE) devices, especially organic photovoltaic (OPV) cells and OLED devices, to methods for preparing OE devices using the novel compositions, and to OE devices, OLED devices and OPV cells prepared from such methods and compositions.

20 Claims, 2 Drawing Sheets

(56) References Cited

U.S. PATENT DOCUMENTS

Figure 1A:
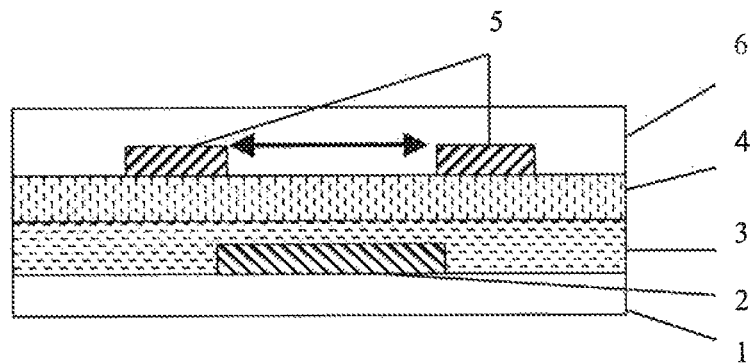

| | | | |
|---|---|---|---|
| 2008/0191199 A1* | 8/2008 | Anemian | C07C 15/28 257/40 |
| 2008/0206447 A1 | 8/2008 | Inoue et al. | |
| 2009/0149627 A1 | 6/2009 | Pan et al. | |
| 2010/0243960 A1 | 9/2010 | Matsue et al. | |
| 2011/0006265 A1 | 1/2011 | James et al. | |

FOREIGN PATENT DOCUMENTS

| | | |
|---|---|---|
| EP | 2216380 A1 | 8/2010 |
| JP | 2006128256 A | 5/2006 |
| JP | 2006156824 A | 6/2006 |
| JP | 2006-523740 A | 10/2006 |
| JP | 2007258724 A | 10/2007 |
| JP | 2008303365 A | 12/2008 |
| JP | 2009536981 A | 10/2009 |
| WO | WO-200059267 A1 | 10/2000 |
| WO | WO-2004093207 A3 | 6/2005 |
| WO | WO-2008107089 A1 | 9/2008 |
| WO | WO-2009064026 A1 | 5/2009 |
| WO | WO-2009109273 A1 | 9/2009 |
| WO | WO-2009122870 A1 | 10/2009 |

OTHER PUBLICATIONS

English translation of Japanese First Office Action in patent application No. 2013-504153, dated Jun. 28, 2016.

\* cited by examiner

COMPOSITION AND METHOD FOR PREPARATION OF ORGANIC ELECTRONIC DEVICES

CROSS-REFERENCE TO RELATED APPLICATIONS

This application is a continuation application of U.S. application Ser. No. 13/640,408 filed Oct. 10, 2012, now abandoned, which is a national stage application (under 35 U.S.C. § 371) of PCT/EP2011/001682, filed Apr. 5, 2011, which claims benefit of European application 10003857.9, filed Apr. 12, 2010

FIELD OF THE INVENTION

The present invention relates to novel compositions comprising an organic semiconducting compound (OSC), to their use as conducting inks for the preparation of organic electronic (OE) devices, especially organic photovoltaic (OPV) cells and OLED devices, to methods for preparing OE devices using the novel formulations, and to OE devices and OPV cells prepared from such methods and compositions.

BACKGROUND AND PRIOR ART

When preparing OE devices like OFETs or OPV cells, in particular flexible devices, usually printing or coating techniques like inkjet printing, roll to roll printing, slot dye coating or flexographic/gravure printing are used to apply the OSC layer. Based on low solubility of the most of the present organic compounds useful as OSC these techniques need the use of solvents in high amounts. In order to reduce solvent de-wetting and to increase dry film levelness surfactants can be used. These additives are especially needed with regard to small molecular OSC or polymeric OSC having a low molecular weight. The use of conventional surfactants or wetting agents is disclosed, e.g. in WO 2009/049744. However, no explicit examples are mentioned. Based on the low solubility of the most of the OSC materials the amounts of surfactants needed are high in relation to the amount of OSC material in the ink formulation.

Furthermore, WO 2009/109273 describes compositions comprising special solvents in order to achieve specific viscosity. The specific viscosity is needed to apply the composition via application methods as roll to roll printing, slot dye coating or flexographic/gravure printing etc. without the need of using high amounts of polymeric binder. However, according to some embodiments of these compositions, these binders can be used as optional components. In addition thereto, the compositions may comprise wetting agents as mentioned above.

Moreover, JP 2001-288416 discloses a coating liquid composition dissolved or dispersed in at least two organic solvents comprising a liquid solvent and a solid solvent. Using a combination of a liquid solvent and a solid solvent provides a thin film having a functional material in a highly dispersed isotropic state.

The OE devices as disclosed in WO 2009/049744, WO 2009/109273 and JP 2001-288416 show useful efficiencies and lifetimes. However, it is a permanent desire to improve the performance of the OSC layer, such as efficiency, lifetime and sensitivity regarding oxidation or water.

In addition thereto, the formation of films having a high leveling is difficult without the use of high amounts of wetting agents. However, these wetting agents may have some drawbacks regarding the performance of the films formed.

Furthermore, the production of multilayer devices based on the technology as mentioned above is difficult to achieve. In order to apply an additional layer on an existing layer, generally the composition subsequently applied comprises a solvent which does not dissolve the existing film. Such approach is usually called orthogonal solvent approach. However, if the organic semiconducting compounds of the existing film and the semiconducting compounds of the subsequently applied composition have similar properties and are soluble in similar solvents such approach is difficult to achieve.

It is therefore desirable to have improved compositions comprising an OSC that are suitable for the preparation of OE devices, especially thin film transistors, diodes. OLED displays and OPV cells, which allow the manufacture of high efficient OE devices having a high performance, a long lifetime and a low sensitivity against water or oxidation. One aim of the present invention is to provide such improved compositions. Another aim is to provide improved methods of preparing an OE device from such compositions. Another aim is to provide improved OE devices obtained from such compositions and methods. In particular, another aim is to provide improved methods for preparing multilayer devices. Further aims are immediately evident to the person skilled in the art from the following description.

Surprisingly it has been found that these aims can be achieved, and the above-mentioned problems can be solved, by providing methods, materials and devices as claimed in the present invention, especially by providing a process for preparing an OE device using a composition being solid at a temperature of 25° C. and fluid at a higher temperature and the boiling point of the solvent is at most 400° C.

SUMMARY OF THE INVENTION

The present invention relates to a composition comprising one or more organic semiconducting compounds (OSC), and one or more organic solvents, characterized in that said composition is solid at a temperature of 25° C. and fluid at a higher temperature and the boiling point of the solvent is at most 400° C.

The present invention further relates to the use of a composition as described above and below as coating or printing ink, especially for the preparation of OE devices, in particular for thin film transistors, diodes, OLED devices and rigid or flexible organic photovoltaic (OPV) cells and devices.

The present invention further relates to a process of preparing an organic electronic (OE) device, comprising the steps of
a) depositing the composition as described above and below onto a substrate to form a film or layer,
b) removing the solvent(s).

The present invention further relates to an OE device prepared from a composition and/or by a process as described above and below.

The OE devices include, without limitation, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laserdiodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

According to a preferred embodiment, the present invention provides organic light emitting diodes (OLED). OLED devices can for example be used for illumination, for medical illumination purposes, as signalling device, as signage devices, and in displays. Displays can be addressed using passive matrix driving, total matrix addressing or active matrix driving. Transparent OLEDs can be manufactured by using optically transparent electrodes. Flexible OLEDs are assessable through the use of flexible substrates.

The compositions, methods and devices of the present invention provide surprising improvements in the efficiency of the OE devices and the production thereof. Unexpectedly, the performance, the lifetime and the efficiency of the OE devices can be improved, if these devices are achieved by using a composition of the present invention. Furthermore, the composition of the present invention provides an astonishingly high level of film forming. Especially, the homogeneity and the quality of the films can be improved. In addition thereto, the present invention enables better printing of multi layer devices.

A BRIEF DESCRIPTION OF THE FIGURES

FIG. 1A exemplarily and schematically depicts a typical bottom gate (BG), top contact (TC) OFET device according to the present invention, comprising a substrate (1), a gate electrode (2), a layer of dielectric material (3) (also known as gate insulator layer), an OSC layer (4), and source and drain (S/D) electrodes (5), and an optional passivation or protection layer (6).

Figure 1B:
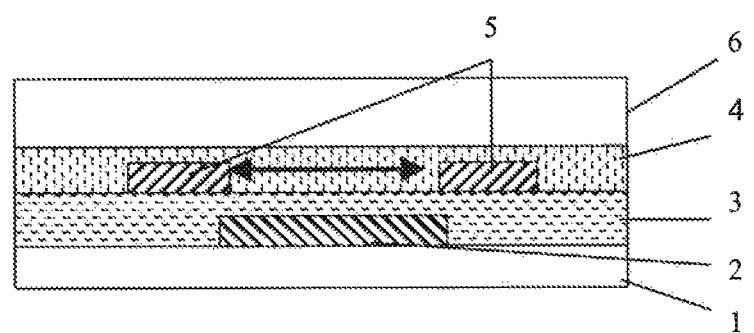

FIG. 1B exemplarily and schematically depicts a typical bottom gate (BG), bottom contact (BC) OFET device according to the present invention, comprising a substrate (1), a gate electrode (2), a dielectric layer (3), S/D electrodes (5), an OSC layer (4), and an optional passivation or protection layer (6).

Figure 2:
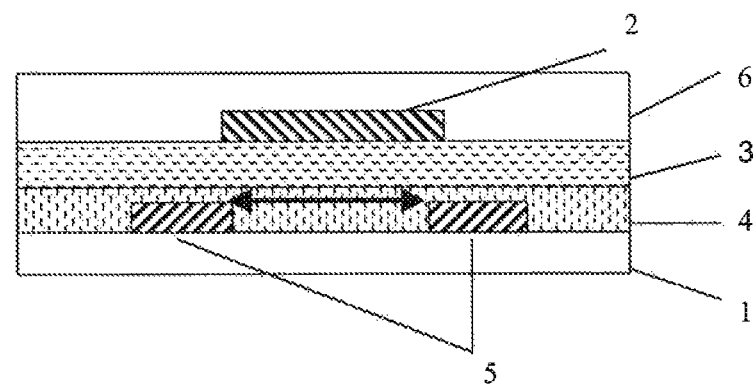

FIG. 2 exemplarily and schematically depicts a top gate (TG) OFET device according to the present invention, comprising a substrate (1), source and drain electrodes (5), an OSC layer (4), a dielectric layer (3), and a gate electrode (2), and an optional passivation or protection layer (6).

Figure 3:
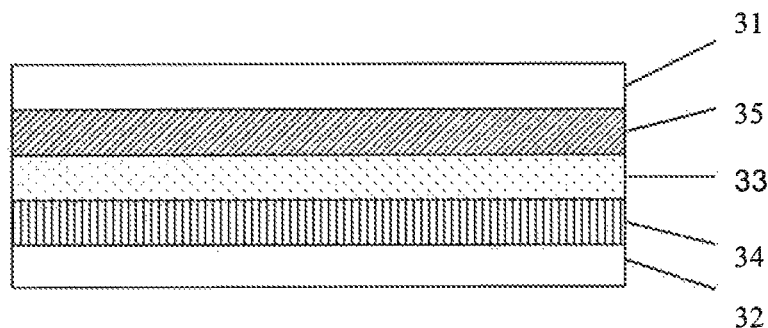
Figure 4:
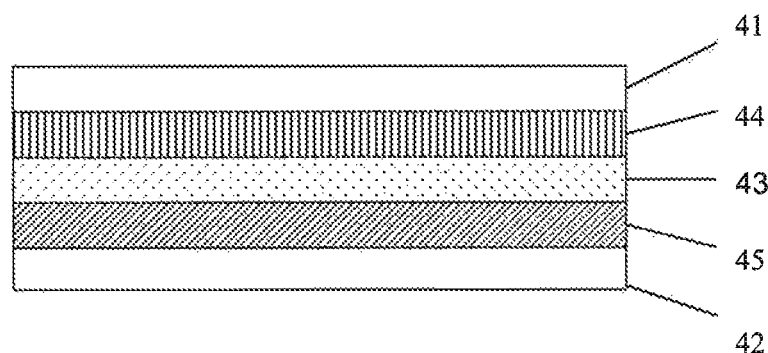

FIGS. 3 and 4 exemplarily and schematically depict typical and preferred OPV devices according to the present invention.

Figure 5:
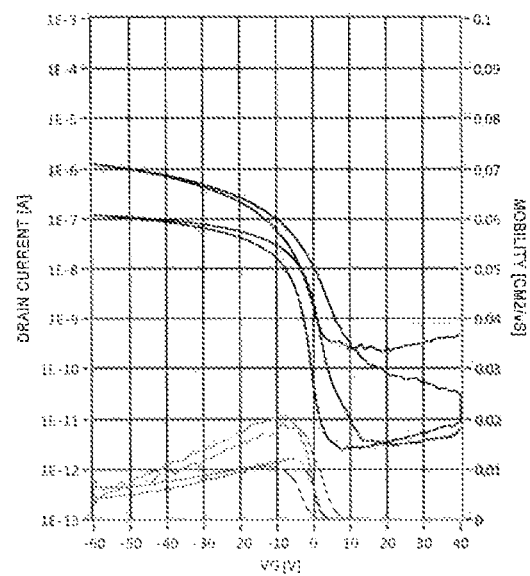

FIG. 5 depicts the transistor characteristic and the linear and saturation mobility of the device.

DETAILED DESCRIPTION OF THE INVENTION

The present invention provides a composition being solid at a temperature of 25° C. and fluid at a higher temperature. These type of coating compositions or printing inks can be called hot melt formulation based on the fact that the application of such compositions is performed at temperatures above 25° C.

Preferably said composition is solid at a temperature of 30° C., especially 35° C., particularly 40° C., more preferably 50° C. and most preferably 60° C. The higher the temperature at which the composition is solid the easier the printing can be fixed on the substrate. The term solid means that the viscosity of the ink is very high such that the composition cannot be applied by usual printing techniques. Therefore, a composition comprising a viscosity of at least 500 Pas at the temperatures as mentioned above and below (especially 25° C.) is considered solid. The viscosity values are measured with a parallel plate rotational viscometer or rheometer (TA Instruments) at a shear rate of 500 s$^{-1}$, unless stated otherwise.

However, if the inks are solid at very high temperatures, these inks need to be applied at very high temperatures. High processing temperatures need special equipment and stable organic semiconducting compounds. Based on such issues, the composition of the present invention is preferably fluid at a temperature of 200° C. or less, especially 150° C. or less, more preferably 120° C. or less, and most preferably 100° C. or less.

The term fluid means that the viscosity of the ink is in a range such that the composition can be processed by usual printing techniques as mentioned above and below. Therefore, a composition comprising a viscosity in the range of 0.1 to 2000 mPas at the temperatures as mentioned above and below (200° C., 150° C., 120° C. and 100° C., respectively) is considered fluid. The viscosity values are measured with a parallel plate rotational viscometer or rheometer (TA Instruments) at a sheer rate of 500 s$^{-1}$, unless stated otherwise.

Preferably, the composition has a viscosity in the range of 0.25 to 100 mPas, especially 1.0 to 40 mPas, more preferably in the range of 2.0 to 20 mPas and most preferably in the range of 2.1 to 15 mPas. The viscosity is determined at a shear rate of 500 s$^{-1}$ by measuring on AR-G2 rheometer manufactured by TA Instruments. This is measured using parallel plate geometry. The temperature to determine the viscosity is preferably about 10° C. above the melting point of the solvent having the highest boiling point. If merely fluid solvents are used, the viscosity can be determined at a processing temperature of the composition. Preferably, the composition of the present invention comprises a surface tension in the range of 20 to 60 mN/m, more preferably 25 to 45 mN/m. The surface tension can be measured using a FTA (First Ten Angstrom) 125 contact angle goniometer as mentioned above and below. The surface tension can be achieved by selection the polymeric binder and the solvent in an appropriate manner. Furthermore, the surface tension can be achieved by using a wetting agent, preferably a volatile wetting agent as mentioned below. The temperature to determine the surface tension is preferably about 10° C. above the melting point of the solvent having the highest boiling point.

Preferably, the composition can be filtered e.g. to 1 micron or less.

The composition of the present invention comprises one or more solvents. The solvents are preferably selected from the group consisting of aromatic hydrocarbons, like toluene, o-, m- or p-xylene, trimethylbenzenes (e.g. 1,2,3-, 1,2,4- and 1,3,5-trimethylbenzenes), tetralin, other mono-, di-, tri- and tetraalkylbenzenes (e.g. diethylbenzenes, methylcumene, tetramethylbenzenes etc), aromatic ethers (e.g. anisole, alkylanisoles, e.g. 2, 3 and 4 isomers of methylanisole, 2,3-, 2,4-, 2,5-, 2,6-, 3,4- and 3,5-isomers of dimethylanisole), naphthalene derivatives, alkylnaphthalene derivatives (e.g. 1- and 2-methylnaphthalene), di- and tetrahydronaphthalene derivatives. Also preferred are aromatic esters (e.g alkylbenzoates), aromatic ketones (e.g. acetophenone, propiophenone), alkylketones (e.g. cyclohexanone), aromatic ketones (e.g benzophenone), heteroaromatic solvents (e.g. thiophene, mono-, di- and trialkylthiophenes, 2-alkyl-thiazoles, benzthiazoles etc, pyridines), halogenaryls and aniline derivatives. These solvents may comprise halogen atoms.

Especially preferred are: 3-fluorotrifluoromethylbenzene, trifluoromethyl-benzene, dioxane, trifluoromethoxybenzene, 4-fluorobenzenetrifluoride, 3-fluoropyridine, toluene, 2-fluorotoluene, 2-fluorobenzenetrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene, m-xylene, o-xylene, 2,6-lutidine, 2-fluoro-m-xylene, 3-fluoro-o-xylene, 2-chlorobenzenetrifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzenediooxol, 4-methylanisole, 3-methylanisole, 4-fluoro-3-methylanisole, 1,2-dichlorobenzene, 2-fluorobenzenenitril, 4-fluoroveratrol, 2,6-dimethylanisole, aniline, 3-fluorobenzenenitril, 2,5-dimethylanisole, 3,4-dimethylanisole, 2,4-dimethylanisole, benzenenitrile, 3,5-dimethylanisole, N,N-dimethylaniline, 1-fluoro-3,5-dimethoxybenzene, phenylacetate, N-methylaniline, methylbenzoate, N-methylpyrrolidone, morpholine, 1,2-dihydronaphthalene, 1,2,3,4-tetrahydronaphthalene, o-tolunitrile, veratrole, ethylbenzoate, N,N-diethylaniline, propylbenzoate, 1-methylnaphthalene, butylbenzoate, 2-methylbiphenyl, 2-phenylpyridine or 2,2'-Bitolyl.

In order to achieve a composition being solid at a temperature of 25° C. and fluid at a higher temperature one or more additives can be used.

According to a preferred embodiment of the present invention, solvents can be used being solid at 25° C. and fluid, preferably liquid at higher temperatures, Using these solvents provides astonishingly improvements regarding the performance of the organic electronic devices being obtained using the inventive compositions.

Preferably, the solvent is solid at a temperature of 25° C., particularly of 30° C., especially of 35° C., particularly of 40° C., more preferably of 50° C. and most preferably of 60° C. The term solid is used as mentioned above with regard to the composition. Preferably, the solvent has a melting point at a temperature of 25° C. or above, particularly 30° C. or above, especially 35° C. or above, particularly 40° C. or above, more preferably 50° C. or above and most preferably 60° C. or above.

Preferably the solvent is fluid at a temperature of 200° C. or less, especially 150° C. or less, more preferably 120° C. or less, and most preferably 100° C. or less. The term fluid is used as mentioned above with regard to the composition. According, the solvent has a melting point at a temperature of 200° C. or less, especially 150° C. or less, more preferably 120° C. or less, and most preferably 100° C. or less.

These solvents are not specially limited and may include aliphatic compounds such as alkanes and may comprise functional groups such as hydroxyl groups, carboxylic acid groups or halogens, if these solvents do not react with the organic semiconducting compound. According to a special aspect of the present invention the organic solvent preferably comprises an aromatic and/or heteroaromatic compound, especially an aromatic compound, and more preferably an aromatic hydrocarbon compound. In particular, the organic solvent may comprise a benzene compound, a pyridine compound, a pyrazine compound, a pyrazole compound having a molecular weight of at least 120 g/mol, especially at least 130 g/mol and more preferably at least 140 g/mol, a sulphone compound, a sulfolane compound, an alcohol compound, and/or a naphthalene compound. Preferred benzene compounds include, e.g. 1,2,4,5-tetramethylbenzene, pentamethylbenzene and hexamethylbenzene. Preferred naphthalene compounds include, e.g. 2-methylnaphthalene, 1,5-dimethylnaphthalene and 2-ethoxynaphthalene.

Astonishing improvements can be achieved by a mixture of organic solvent. In particular the solvent mixture may comprise at least one benzene compound, especially having a molecular weight of at least 120 g/mol, especially at least 130 g/mol. Moreover specific mixtures may comprise at least one naphthalene compound.

Examples of compounds useful as solvents are disclosed in Table 1.

TABLE 1

Melting and boiling points of useful solvents

| Solvent | Melting point [° C.] | Boiling point [° C.] |
|---|---|---|
| Sulfolane | 27 | 285 |
| 1,2,3,4-Tetrahydro-1-naphthalene | 30 | 269 |
| 2-Methylnaphthalene (2-MN) | 35 | 241 |
| 2-Ethoxynaphthalene | 36 | 282 |
| 2,3,4,6-Tetrachloropyridine | 38 | 248 |
| Benzyl phenyl ether | 40 | 287 |
| Docosane | 45 | 369 |
| 2,3,5-Trichloropyridine | 48 | 219 |
| Pentamethylbenzene | 50 | 231 |
| Benzophenone | 52 | 305 |
| 5-Indanol | 52 | 255 |
| 1,2,3-Trichlorobenzene | 52 | 218 |
| Pyrazine | 53 | 116 |
| 5,6,7,8-Tetrahydro-2-naphthalene | 60 | 276 |
| p-Bromochlorobenzene | 66 | 196 |
| Di-isopropylnaphthalene | 68 | 279 |
| Pyrazole | 68 | 187 |
| Biphenyl | 69 | 255 |
| 2-Indanol | 70 | 253 |
| Stearic acid | 70 | 361 |
| 2,6-Dichloronitrobenzene | 71 | 272 |
| 1,5-Dimethylnaphthalene (1,5-DMN) | 77 | 265 |
| 1,2,4,5-Tetramethylbenzene | 78 | 197 |
| Naphthalene | 81 | 218 |
| Pentachlorobenzene | 86 | 277 |
| Carbon tetrabromide | 89 | 190 |
| Imidazole | 90 | 256 |
| 3,5-Dimethylpyrazole | 107 | 218 |
| Dimethyl sulphone | 108 | 238 |
| 1,3,5-Tribromobenzene | 120 | 271 |
| Benzoic acid | 123 | 249 |
| Octachloropropane | 160 | 269 |
| Hexamethylbenzene | 165 | 264 |

These solvents can be used as mixture of two, three or more.

Preferably the solvent has a boiling point or sublimation temperature of <400° C., especially ≤350° C., more preferably ≤270° C., most preferably ≤250° C., at the pressure employed, very preferably at atmospheric pressure (1013 hPa). Evaporation can also be accelerated e.g. by applying heat and/or reduced pressure.

Preferably, the organic solvent can comprise a surface tension in the range of 15 to 80 mN/m, more preferably 25 mN/m to 45 mN/m. The surface tension can be measured using a FTA (First Ten Angstrom) 125 contact angle goniometer. Details of the method are available from First Ten Angstrom as published by Roger P. Woodward, Ph.D. "Surface Tension Measurements Using the Drop Shape Method". Preferably, the pendant drop method can be used to determine the surface tension. The temperature for determining the surface tension is preferably in the range of about 30° C. to 200° C., especially 60° C. to 150° C. and more preferably 80° C. to 120° C. According to a special aspect of the present invention, the surface tension of the solvent can be determined at a temperature of 10° C. above the melting point of the solvent. If merely fluid solvents are used, the surface tension can be preferably determined at the application temperature.

Preferred organic solvents can comprise Hansen Solubility parameters of $H_d$ in the range of 17.0 to 23.2 MPa$^{0.5}$, $H_p$ in the range of 0.2 to 12.5 MPa$^{0.5}$ and $H_h$ in the range of 0.9 to 14.2 MPa$^{0.5}$. More preferred organic solvents comprise Hansen Solubility parameters of $H_d$ in the range of 18.5 to 21.0 MPa$^{0.5}$, $H_p$ in the range of 2.0 to 6.0 MPa$^{0.5}$ and $H_h$ in the range of 2.0 to 6.0 MPa$^{0.5}$.

The Hansen Solubility Parameters can be determined according to the Hansen Solubility Parameters in Practice (HSPiP) program ($2^{nd}$ edition) as supplied by Hanson and Abbot et al.

The composition of the present invention preferably comprises at least 70% by weight, more preferably at least 80% by weight and most preferably at least 90% by weight of organic solvents.

The processing temperature used for removing the solvent and any volatile additive should be selected such that the layer, comprising the organic semiconducting material, is not damaged. Preferably the deposition processing temperature is from about 30° C. to 200° C., more preferably 60° C. to 150° C. and most preferably 80° C. to 120° C.

The OSC compounds can be selected from standard materials known to the skilled person and described in the literature. The OSC may be a monomeric compound (also referred to as "small molecule", as compared to a polymer or macromolecule), a polymeric compound, or a mixture, dispersion or blend containing one or more compounds selected from either or both of monomeric and polymeric compounds.

In one preferred embodiment of the present invention the OSC is selected from monomeric compounds, where it is easier to achieve a significant variation in the degree of crystallinity.

According to an aspect of the present invention, the OSC is preferably a conjugated aromatic molecule, and contains preferably at least three aromatic rings, which can be fused or unfused. Unfused rings are connected e.g. via a linkage group, a single bond or a spiro-linkage. Preferred monomeric OSC compounds contain one or more rings selected from the group consisting of 5-, 6- or 7-membered aromatic rings, and more preferably contain only 5- or 6-membered aromatic rings. The material may be a monomer, oligomer or polymer, including mixtures, dispersions and blends.

Each of the aromatic rings optionally contains one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N($R^x$)($R^y$), where $R^x$ and $R^y$ independently of each other denote H, optionally substituted alkyl, optionally substituted aryl, alkoxy or polyalkoxy groups. Where $R^x$ and/or $R^y$ denote alkyl or aryl these may be optionally fluorinated.

Preferred rings are optionally fused, or are optionally linked with a conjugated linking group such as —C($T^1$)=C($T^2$)-, —C≡C—, —N($R^z$)—, —N=N—, —($R^z$)C=N—, —N=C($R^z$)—, wherein $T^1$ and $T^2$ independently of each other denote H, Cl, F, —C≡N— or a lower alkyl group, preferably a $C_{1-4}$ alkyl group, and $R^z$ denotes H, optionally substituted alkyl or optionally substituted aryl. Where $R^z$ is alkyl or aryl these may be optionally fluorinated.

Preferred OSC compounds include small molecules (i.e. monomeric compounds), polymers, oligomers and derivatives thereof, selected from condensed aromatic hydrocarbons such as tetracene, chrysene, pentacene, pyrene, perylene, coronene, or soluble substituted derivatives of the aforementioned; oligomeric para substituted phenylenes such as p-quaterphenyl (p-4P), p-quinquephenyl (p-5P), p-sexiphenyl (p-6P), or soluble substituted derivatives of the aforementioned; conjugated hydrocarbon polymers such as polyacene, polyphenylene, poly(phenylene vinylene), polyfluorene, polyindenofluorene, including oligomers of these conjugated hydrocarbon polymers; conjugated heterocyclic polymers such as poly(3-substituted thiophene), poly(3,4-bisubstituted thiophene), polyselenophene, poly(3-substituted selenophene), poly(3,4-bisubstituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazole, polyisothianaphthene, poly(N-substituted aniline), poly(2-substituted aniline), poly(3-substituted aniline), poly(2,3-bisubstituted aniline), polyazulene, polypyrenepolybenzofuran; polyindole, polypyridazine, polytriarylamines such as optionally substituted polytriphenylamines; pyrazoline compounds; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes or derivatives thereof; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylic diimide; bathophenanthroline; diphenoquinones; 1,3,4-oxadiazoles; 11,11,12,12-tetracyanonaphtho-2,6-quinodimethane; α,α'-bis(dithieno[3,2-b:2',3'-d]thiophene); 2,8-dialkyl, substituted dialkyl, diaryl or substituted diaryl anthradithiophene; 2,2'-bibenzo[1,2-b:4,5-b']-dithiophene. Preferred compounds are those from the above list and derivatives thereof which are soluble.

Especially preferred OSC materials are substituted polyacenes, such as 6,13-bis(trialkylsilylethynyl)pentacene or derivatives thereof, such as 5,11-bis(trialkylsilylethynyl) anthradithiophenes, as described for example in U.S. Pat. No. 6,690,029, WO 2005/055248 A1, or WO 2008/107089 A1. A further preferred OSC material is poly(3-substituted thiophene), very preferably poly(3-alkylthiophenes) (P3AT) wherein the alkyl group is preferably straight-chain and preferably has 1 to 12, most preferably 4 to 10 C-atoms, like e.g. poly(3-hexylthiophene).

Particularly preferred polymeric OSC compounds are polymers or copolymers comprising one or more repeating units selected from the group consisting of thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, 3-substituted selenophene-2,5-diyl, optionally substituted indenofluorene, optionally substituted phenanthrene and optionally substituted triarylamine.

The composition according to the present invention can comprise between 0.01 and 20% by weight, preferably between 0.1 and 15% by weight, more preferably between 0.2 and 10% by weight and most preferably between 0.25 and 5% by weight of OSC materials or the corresponding blend. The percent data relate to 100% of the solvent or solvent mixture. The composition may comprise one or more than one, preferably 1, 2, 3 or more than three OSC compounds.

The organic semiconductor compound used here is either a pure component or a mixture of two or more components, at least one of which must have semiconducting properties. In the case of the use of mixtures, however, it is not necessary for each component to have semiconducting properties. Thus, for example, inert low-molecular-weight compounds can be used together with semiconducting polymers. It is likewise possible to use non-conducting polymers, which serve as inert matrix or binder, together with one or more low-molecular-weight compounds or further polymers having semiconducting properties. For the purposes of this application, the potentially admixed non-conducting component is taken to mean an electro-optically inactive, inert, passive compound.

Preference is given to solutions of polymeric organic semiconductors, which optionally comprise further admixed substances. The molecular weight $M_w$ of the polymeric organic semiconductor is preferably greater than 10,000 g/mol, more preferably between 50,000 and 2,000,000 g/mol and most preferably between 100,000 and 1,000,000 g/mol.

For the purposes of the present invention, polymeric organic semiconductors are taken to mean, in particular, (i) substituted poly-p-arylene-vinylenes (PAVs) as disclosed in EP 0443861, WO 94/20589, WO 98/27136, EP 1025183, WO 99/24526, DE 19953806 and EP 0964045 which are soluble in organic solvents, (ii) substituted polyfluorenes (PFs) as disclosed in EP 0842208, WO 00/22027, WO 00/22026, DE 19846767, WO 00/46321, WO 99/54385 and WO 00155927 which are soluble in organic solvents, (iii) substituted polyspirobifluorenes (PSFs) as disclosed in EP 0707020, WO 96/17036, WO 97/20877, WO 97/31048, WO 97/39045 and WO 031020790 which are soluble in organic solvents, (iv) substituted poly-para-phenylenes (PPPs) or -biphenylenes as disclosed in WO 92/18552, WO 95/07955, EP 0690086, EP 0699699 and WO 03/099901 which are soluble in organic solvents, (v) substituted polydihydrophenanthrenes (PDHPs) as disclosed in WO 05/014689 which are soluble in organic solvents, (vi) substituted poly-trans-indenofluorenes and poly-cis-indenofluorenes (PIFs) as disclosed in WO 04/041901 and WO 04/113412 which are soluble in organic solvents, (vii) substituted polyphenanthrenes as disclosed in DE 102004020298 which are soluble in organic solvents, (viii) substituted polythiophenes (PTs) as disclosed in EP 1028136 and WO 95/05937 which are soluble in organic solvents, (ix) polypyridines (PPys) as disclosed in T. Yamamoto et al., J. Am. Chem. Soc. 1994, 116, 4832 which are soluble in organic solvents, (x) polypyrroles as disclosed in V. Gelling et at, Polym. Prepr. 2000, 41, 1770 which are soluble in organic solvents, (xi) substituted, soluble copolymers having structural units from two or more of classes (i) to (x), as described, for example, in WO 02/077060, (xii) conjugated polymers as disclosed in Proc. of ICSM '98, Part I & II (in: Synth. Met 1999, 101/102) which are soluble in organic solvents, (xiii) substituted and unsubstituted polyvinylcarbazoles (PVKs), as disclosed, for example, in R. C. Penwell et al., J. Polym. Sci., Macromol Rev. 1978, 13, 63-160, (xiv) substituted and unsubstituted triarylamine polymers, as disclosed, for example, in JP 2000/072722, (xv) substituted and unsubstituted polysilylenes and polygermylenes, as disclosed, for example, in M. A. Abkowitz and M. Stolka, Synth. Met. 1996, 78, 333, and (xvi) soluble polymers containing phosphorescent units, as disclosed, for example in EP 1245659, WO 03/001616, WO 03/018653, WO 03/022908, WO 03/080687, EP 1311138, WO 031102109, WO 04/003105, WO 04/015025, DE 102004032527 and some of the specifications already cited above.

According to a further embodiment of the present invention, the organic semiconducting compound preferably has a molecular weight of 5000 g/mol or less, more preferably a molecular weight of 2000 g/mol or less.

According to a special embodiment of the present invention, the OSC can be used for example as the active channel material in the semiconducting channel of an OFET, or as a layer element of an organic rectifying diode.

In case of OFET devices, where the OFET layer contains an OSC as the active channel material, it may be an n- or p-type OSC. The semiconducting channel may also be a composite of two or more OSC compounds of the same type, i.e. either n- or p-type. Furthermore, a p-type channel OSC compound may for example be mixed with an n-type OSC compound for the effect of doping the OSC layer. Multilayer semiconductors may also be used. For example, the OSC may be intrinsic near the insulator interface and a highly doped region can additionally be coated next to the intrinsic layer.

Preferred OSC compounds have a FET mobility of greater than $1\times10^{-5}$ cm$^2$V$^{-1}$ s$^{-1}$, more preferably greater than $1\times10^{-2}$ cm$^2$ V$^{-1}$ s$^{-1}$.

Particularly preferred polymeric OSC compounds comprise repeating units which are selected from formulae P1-P7:

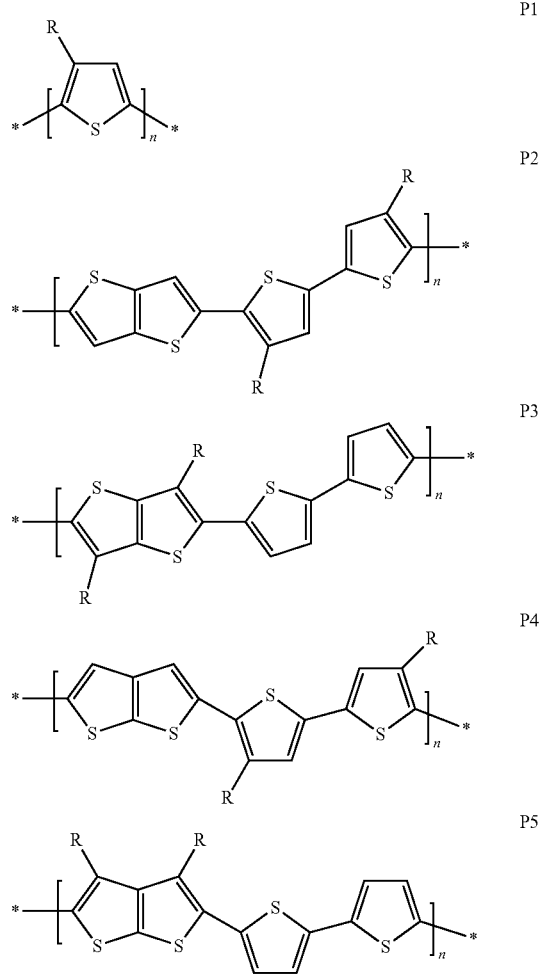

-continued

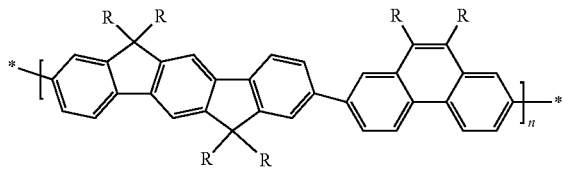

P6

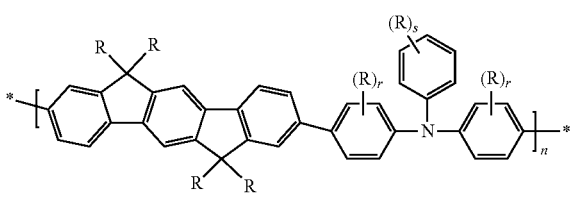

P7 wherein n is an integer >1, preferably from 10 to 1,000,

R on each occurrence identically or differently denotes H, F, Cl, Br, I, CN, a straight-chain, branched or cyclic alkyl group having from 1 to 40 C atoms, in which one or more C atoms are optionally replaced by O, S, O—CO, CO—O, O—CO—O, $CR^0$=$CR^0$ or C≡C such that O- and/or S-atoms are not linked directly to each other, and in which one or more H atoms are optionally replaced by F, Cl, Br, I or CN, or denotes an aryl or heteroaryl group having from 4 to 20 ring atoms that is unsubstituted or substituted by one or more non-aromatic groups $R^s$, and wherein one or more groups R may also form a mono- or polycyclic aliphatic or aromatic ring system with one another and/or with the ring to which they are attached, $R^s$ on each occurrence identically or differently denotes F, Cl, Br, I, CN, $Sn(R^{00})_3$, $Si(R^{00})_3$ or $B(R^{00})_2$ a straight-chain, branched or cyclic alkyl group having from 1 to 25 C atoms, in which one or more C atoms are optionally replaced by O, S, O—CO, CO—O, O—CO—O, $CR^0$=$CR^0$, C≡C such that O- and/or S-atoms are not linked directly to each other, and in which one or more H atoms are optionally replaced by F, Cl, Br, I or CN, or $R^s$ denotes an aryl or heteroaryl group having from 4 to 20 ring atoms that is unsubstituted or substituted by one or more non-aromatic groups $R^s$, and wherein one or more groups $R^s$ may also form a ring system with one another and/or with R, $R^0$ on each occurrence identically or differently denotes H, F, Cl, CN, alkyl having from 1 to 12 C atoms or aryl or heteroaryl having from 4 to 10 ring atoms, $R^{00}$ on each occurrence identically or differently denotes H or an aliphatic or aromatic hydrocarbon group having from 1 to 20 C atoms, wherein two groups $R^{00}$ may also form a ring together with the hetero atom (Sn, Si or B) to which they are attached, r is 0, 1, 2, 3 or 4, s is 0, 1, 2, 1, 2, 3, 4 wherein R in formulae P1-P5 is preferably different from H.

Especially preferred monomeric OSC compounds are selected from the group consisting of substituted oligoacenes such as pentacene, tetracene or anthracene, or heterocyclic derivatives thereof, like bis(trialkylsilylethynyl) oligoacenes or bis(trialkylsilylethynyl) heteroacenes, as disclosed for example in U.S. Pat. No. 6,690,029, WO 2005/055248 A1 or U.S. Pat. No. 7,385,221.

Particularly preferred monomeric OSC compounds are selected from formula M1 (polyacenes):

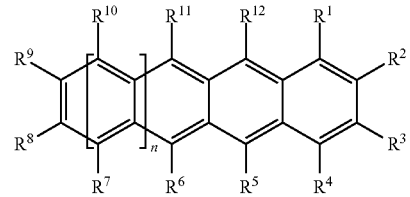

M1 wherein each of $R^1$, $R^2$, $R^3$, $R^4$, $R^5$, $R^6$, $R^7$, $R^8$, $R^9$, $R^{10}$, $R^{11}$ and $R^{12}$, which may be the same or different, independently represents: hydrogen; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)$NH_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a $CF_3$ group; a halo group (Cl, Br, F); or an optionally substituted silyl or alkynylsilyl group; and wherein independently each pair of $R^1$ and $R^2$, $R^2$ and $R^3$, $R^3$ and $R^4$, $R^7$ and $R^8$, $R^8$ and $R^9$, $R^9$ and $R^{10}$, is optionally cross-bridged to form a $C_4$-$C_{40}$ saturated or unsaturated ring, which saturated or unsaturated ring may be intervened by an oxygen atom, a sulphur atom or a group of the formula —N($R^a$), wherein $R^a$ is a hydrogen atom or an optionally substituted hydrocarbon group, or may optionally be substituted; and wherein one or more of the carbon atoms of the polyacene skeleton may optionally be substituted by a heteroatom selected from N, P, As, O, S, Se and Te; and wherein independently any two or more of the substituents $R^1$-$R^{12}$ which are located on adjacent ring positions of the polyacene may, together, optionally constitute a further $C_4$-$C_{40}$ saturated or unsaturated ring optionally intervened by O, S or —N($R^a$), where $R^a$ is as defined above, or an aromatic ring system, fused to the polyacene; and wherein n is 0, 1, 2, 3 or 4 preferably n is 0, 1 or 2, most preferably n is 0 or 2, meaning that the polyacene compound is a pentacene compound (if n=2) or a "pseudo pentacene" compound (if n=0).

Very preferred are compounds of formula M1a (substituted pentacenes):

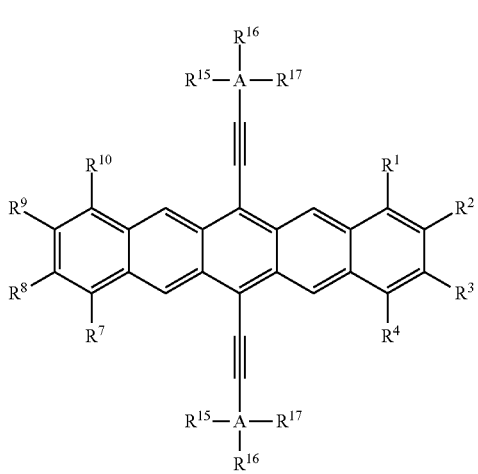

M1a

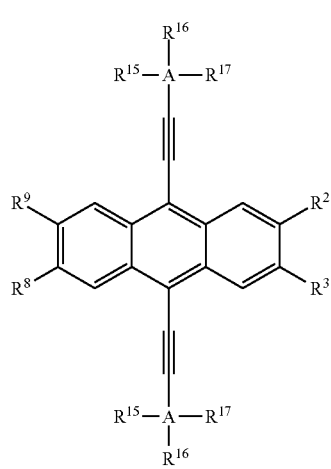

M1b wherein $R^1$, $R^2$, $R^3$, $R^4$, $R^7$, $R^8$, $R^9$, $R^{10}$, $R^{15}$, $R^{16}$, $R^{17}$ each independently are the same or different and each independently represents: H; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and A represents Silicon or Germanium; and wherein independently each pair of $R^1$ and $R^2$, $R^2$ and $R^3$, $R^3$ and $R^4$, $R^7$ and $R^8$, $R^8$ and $R^9$, $R^9$ and $R^{10}$, $R^{15}$ and $R^{16}$, and $R^{16}$ and $R^{17}$ is optionally cross-bridged with each other to form a $C_4$-$C_{40}$ saturated or unsaturated ring, which saturated or unsaturated ring is optionally intervened by an oxygen atom, a sulphur atom or a group of the formula —N(R$^a$)—, wherein R$^a$ is a hydrogen atom or a hydrocarbon group, or is optionally substituted; and wherein one or more of the carbon atoms of the polyacene skeleton is optionally substituted by a heteroatom selected from N, P, As, O, S, Se and Te.

Further preferred are compounds of formula M1b (substituted heteroacenes):

wherein $R^2$, $R^3$, $R^8$, $R^9$, $R^{15}$, $R^{16}$, $R^{17}$ each independently are the same or different and each independently represents: H; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and A represents Silicon or Germanium; and wherein independently each pair of $R^2$ and $R^3$, $R^8$ and $R^9$, $R^{15}$ and $R^{16}$, and $R^{16}$ and $R^{17}$ is optionally cross-bridged with each other to form a $C_4$-$C_{40}$ saturated or unsaturated ring, which saturated or unsaturated ring is optionally intervened by an oxygen atom, a sulphur atom or a group of the formula —N(R$^a$)—, wherein R$^a$ is a hydrogen atom or a hydrocarbon group, and is optionally substituted; and wherein one or more of the carbon atoms of the polyacene skeleton is optionally substituted by a heteroatom selected from N, P, As, O, S, Se and Te.

Especially preferred are compounds of subformula M1b, wherein at least one pair of $R^2$ and $R^3$, and $R^8$ and $R^9$ is cross-bridged with each other to form a $C_4$-$C_{40}$ saturated or unsaturated ring, which is intervened by an oxygen atom, a sulphur atom or a group of the formula —N(R$^a$)—, wherein R$^a$ is a hydrogen atom or a hydrocarbon group, and which is optionally substituted.

Especially preferred are compounds of subformula M1b1 (silylethynylated heteroacenes):

M1b1

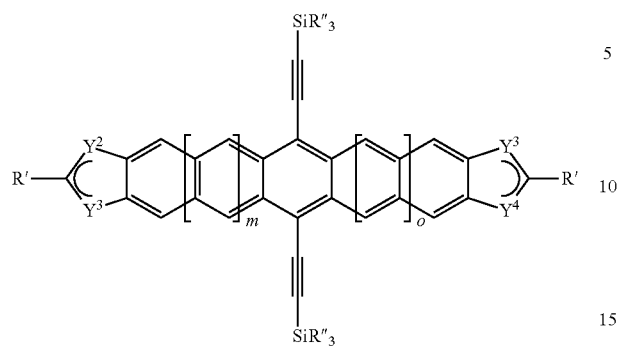

wherein
one of $Y^1$ and $Y^2$ denotes —CH= or =CH— and the other denotes —X—,
one of $Y^3$ and $Y^4$ denotes —CH= or =CH— and the other denotes —X—,
X is —O—, —S—, —Se— or —NR'''—,
R' is H, F, Cl, Br, I, CN, straight-chain or branched alkyl or alkoxy that have 1 to 20, preferably 1 to 8 C-atoms and are optionally fluorinated or perfluorinated, optionally fluorinated or perfluorinated aryl having 6 to 30 C-atoms, preferably $C_6F_5$, or $CO_2R''''$, with R'''' being H, optionally fluorinated alkyl having 1 to 20 C-atoms or optionally fluorinated aryl having 2 to 30, preferably 5 to 20 C-atoms,
R'' is, in case of multiple occurrence independently of one another, cyclic, straight-chain or branched alkyl or alkoxy that have 1 to 20, preferably 1 to 8 C-atoms, or aryl having 2 to 30 C-atoms, all of which are optionally fluorinated or perfluorinated, with $SiR''_3$ preferably being trialkylsilyl,
R''' is H or cyclic, straight-chain or branched alkyl with 1 to 10 C-atoms, preferably H,
m is 0 or 1,
o is 0 or 1.

Especially preferred are compounds of formula M1b1 wherein m and o are 0, and/or X is S, and/or R' is F.

In a preferred embodiment the compound of subformula M1b1 is provided and used as a mixture of the anti- and syn-isomers of the following formulae M1b1a

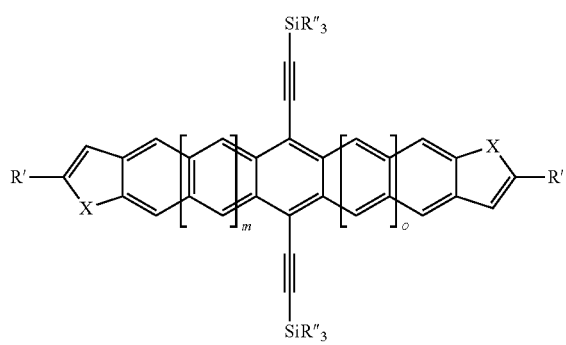

M1b1b

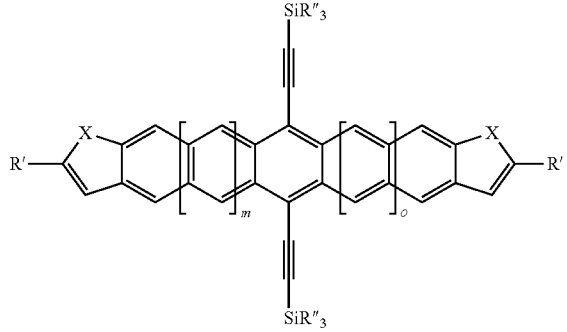

wherein X, R, R', R'' m and o have independently of each other one of the meanings given in formula M1 b1 or one of the preferred meanings given above and below, X is preferably S, and m and o are preferably 0.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, more preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups optionally contain one or more hetero atoms, especially selected from N, O, S, P, Si, Se, As, Te and Ge. The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_6$-$C_{12}$ aryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Aryl and heteroaryl preferably denote a mono-, bi- or tricyclic aromatic or heteroaromatic group with up to 25 C atoms that may also comprise condensed rings and is optionally substituted with one or more groups L, wherein L is halogen or an alkyl, alkoxy, alkylcarbonyl or alkoxycarbonyl group with 1 to 12 C atoms, wherein one or more H atoms may be replaced by F or Cl.

Especially preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above.

Especially preferred substituents R, $R^s$ and $R^{1-17}$ in the above formulae and subformulae are selected from straight chain, branched or cyclic alkyl having from 1 to 20 C atoms, which is unsubstituted or mono- or polysubstituted by F, Cl, Br or I, and wherein one or more non-adjacent $CH_2$ groups are optionally replaced, in each case independently from one another, by —O—, —S—, —$NR^b$—, —$SiR^bR^c$—, —$CX^1=CX^2$— or —C≡C— in such a manner that O and/or S atoms are not linked directly to one another, or denotes optionally substituted aryl or heteroaryl preferably having from 1 to 30 C-atoms, with $R^b$ and $R^c$ being independently of each other H or alkyl having from 1 to 12 C-atoms, and $X^1$ and $X^2$ being independently of each other H, F, Cl or CN.

$R^{15-17}$ and R" are preferably identical or different groups selected from a $C_1$-$C_{40}$-alkyl group, preferably $C_1$-$C_4$-alkyl, most preferably methyl, ethyl, n-propyl or isopropyl, a $C_6$-$C_{40}$-aryl group, preferably phenyl, a $C_6$-$C_{40}$-arylalkyl group, a $C_1$-$C_{40}$-alkoxy group, or a $C_5$-$C_{40}$-arylalkyloxy group, wherein all these groups are optionally substituted for example with one or more halogen atoms. Preferably, $R^{15-17}$ and R" are each independently selected from optionally substituted $C_{1-12}$-alkyl, more preferably $C_{1-4}$-alkyl, most preferably $C_{1-3}$-alkyl, for example isopropyl, and optionally substituted $C_{6-10}$-aryl, preferably phenyl. Further preferred is a silyl group of formula —$SiR^{15}R^{16}$ wherein $R^{15}$ is as defined above and $R^{16}$ forms a cyclic silyl alkyl group together with the Si atom, preferably having 1 to 8 C atoms.

In one preferred embodiment all of $R^{15-17}$, or all of R", are identical groups, for example identical, optionally substituted, alkyl groups, as in triisopropylsilyl. Very preferably all of $R^{15-17}$, or all of R", are identical, optionally substituted $C_{1-10}$, more preferably $C_{1-4}$, most preferably $C_{1-3}$ alkyl groups. A preferred alkyl group in this case is isopropyl.

Preferred groups —$SiR^{15}R^{16}R^{17}$ and $SIR"_3$ include, without limitation, trimethylsilyl, triethylsilyl, tripropylsilyl, dimethylethylsilyl, diethylmethylsilyl, dimethylpropylsilyl, dimethylisopropylsilyl, dipropylmethylsilyl, diisopropylmethylsilyl, dipropylethylsilyl, diisopropylethylsilyl, diethylisopropylsilyl, triisopropylsilyl, trimethoxysilyl, triethoxysilyl, triphenylsilyl, diphenylisopropylsilyl, diisopropylphenylsilyl, diphenylethylsilyl, diethylphenylsilyl, diphenylmethylsilyl, triphenoxysilyl, dimethylmethoxysilyl, dimethylphenoxysilyl, methylmethoxyphenylsilyl, etc., wherein the alkyl, aryl or alkoxy group is optionally substituted.

According to a preferred embodiment of the present invention the OSC material is an organic light emitting material and/or charge transporting material. The organic light emitting materials and charge transporting materials can be selected from standard materials known to the skilled person and described in the literature. Organic light emitting material according to the present application means a material which emits light having a $\lambda_{max}$ in the range from 400 to 700 nm.

Suitable phosphorescent compounds are, in particular, compounds which emit light, preferably in the visible region, on suitable excitation and in addition contain at least one atom having an atomic number greater than 20, preferably greater than 38 and less than 84, more preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium or platinum.

Particularly preferred organic phosphorescent compounds are compounds of formulae (1) to (4):

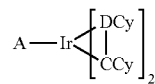

formula (1)

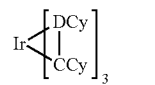

formula (2)

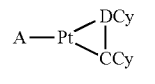

formula (3)

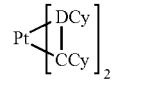

formula (4)

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^{18}$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^{18}$;

A is, identically or differently on each occurrence, a monoanionic, bidentate chelating ligand, preferably a diketonate ligand;

$R^{18}$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^{19}$—, —$CONR^{19}$—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^{18}$ radicals, and a plurality of substituents $R^{18}$, either on the same ring or on two different rings, may together in turn form a mono- or polycyclic, aliphatic or aromatic ring system; and $R^{19}$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^{18}$ radicals.

Formation of ring systems between a plurality of radicals $R^{18}$ means that a bridge may also be present between the groups DCy and CCy.

Furthermore, formation of ring systems between a plurality of radicals $R^{18}$ means that a bridge may also be present between two or three ligands CCy-DCy or between one or two ligands CCy-DCy and the ligand A, giving a polydentate or polypodal ligand system.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973 and DE 102008027005. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, it is known to the person skilled in the art which phosphorescent complexes emit with which emission colour.

Examples of preferred phosphorescent compounds are shown in the following table.

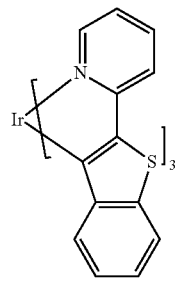
(1)

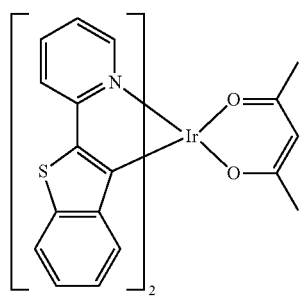
(2)

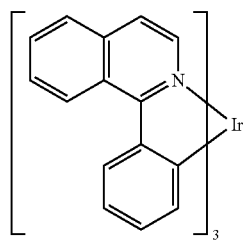
(3)

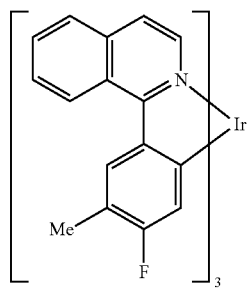
(4)

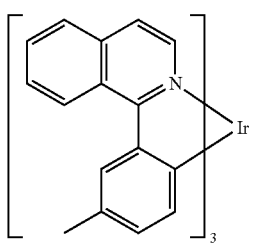
(5)

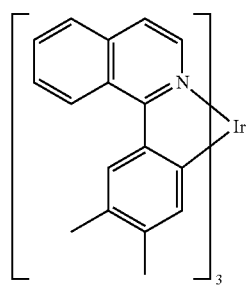
(6)

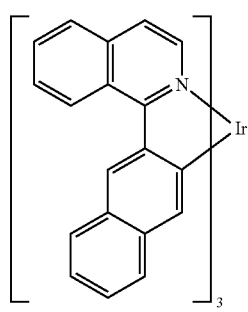
(7)

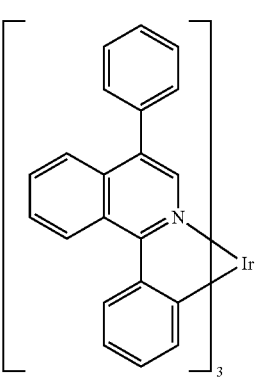
(8)

(9) 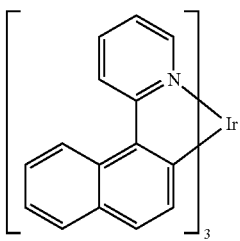
(10) 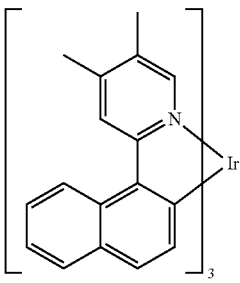
(11) 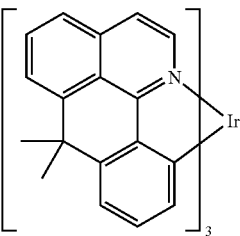
(12) 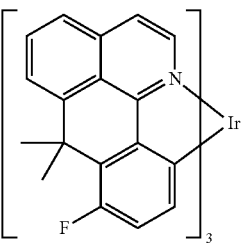
(13) 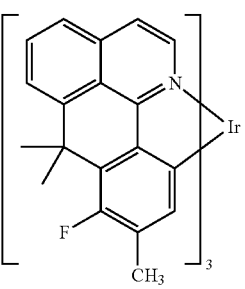
(14) 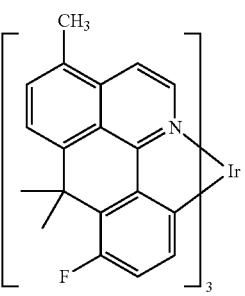
(15) 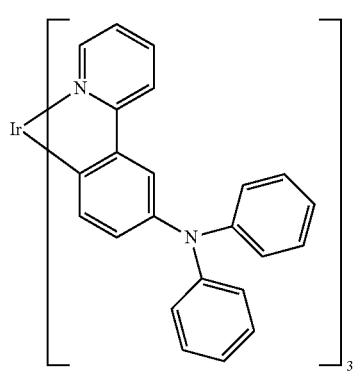
(16) 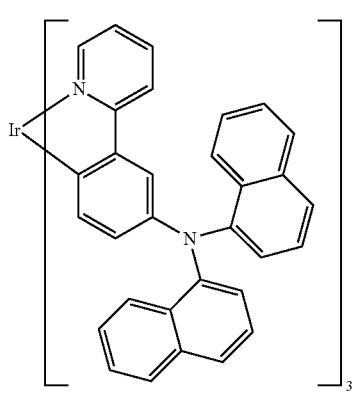
(17) 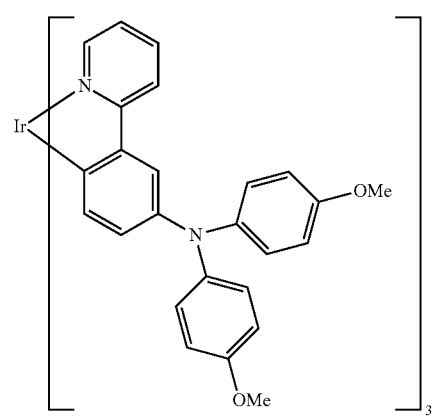
(18) 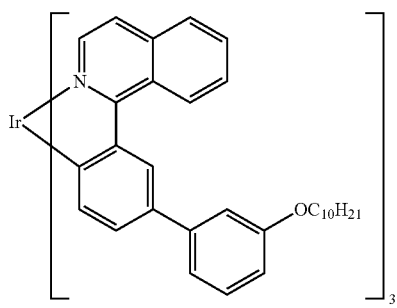

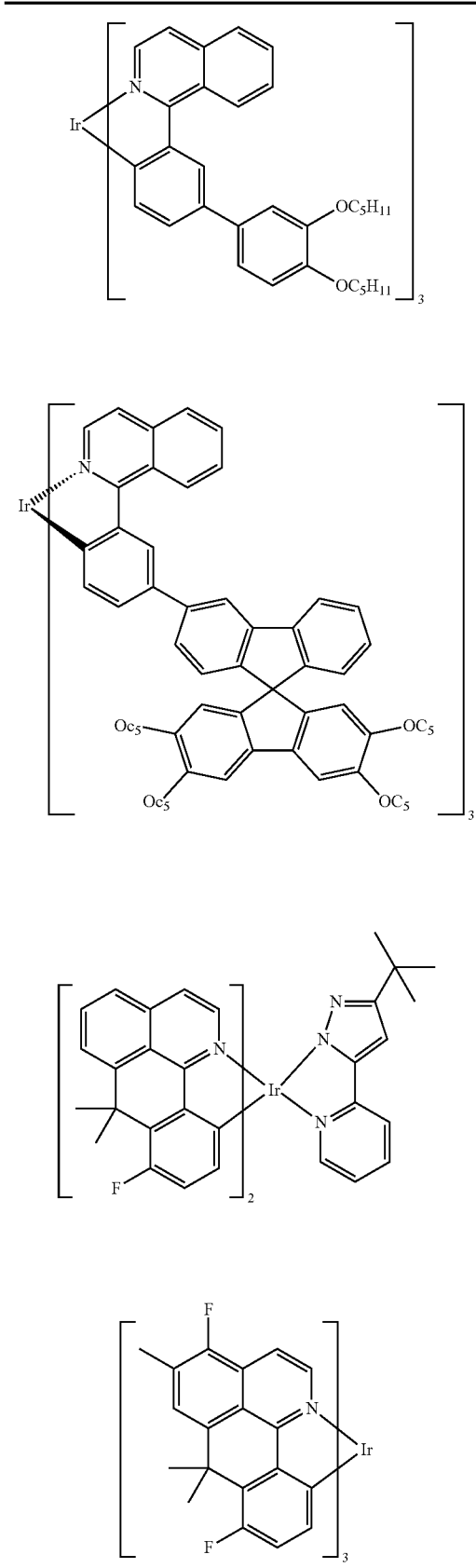
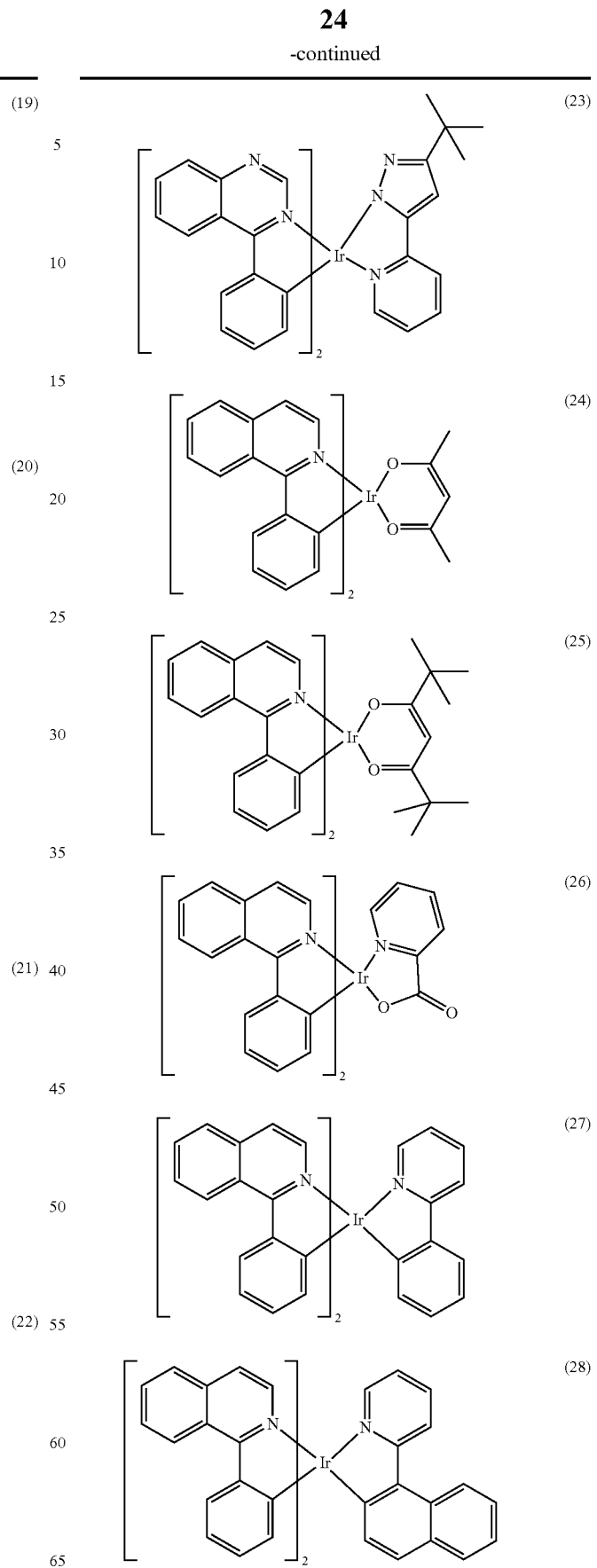

-continued
(29) 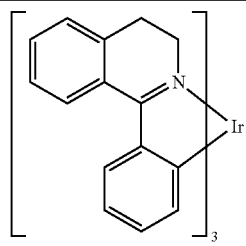
(30) 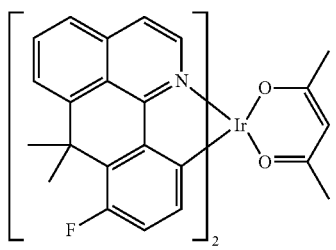
(31) 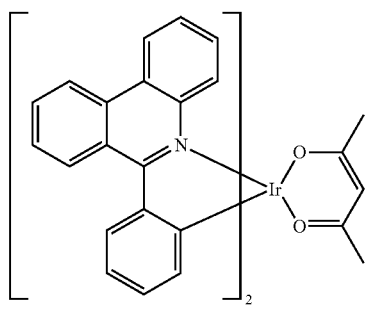
(32) 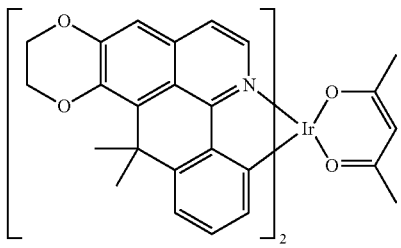
(33) 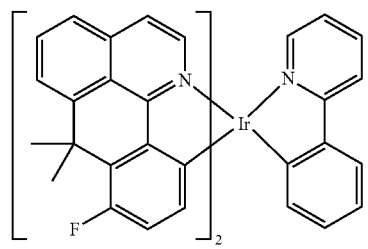
(34) 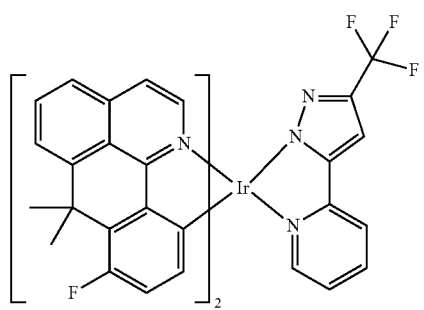
-continued
(35) 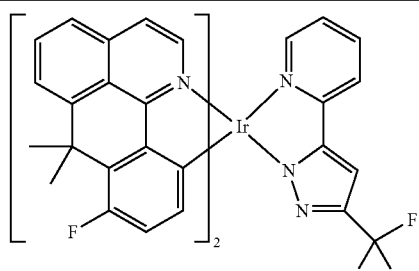
(36) 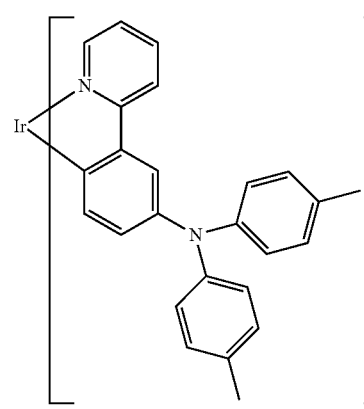
(37) 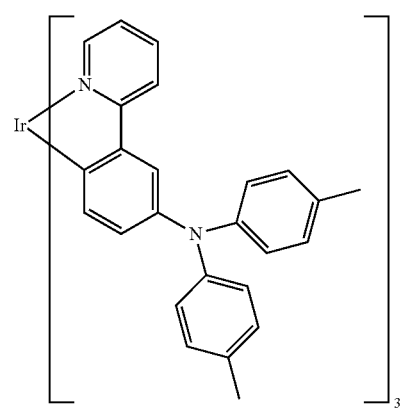
(38) 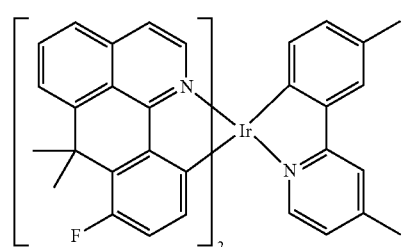
(39) 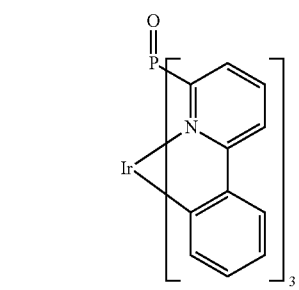

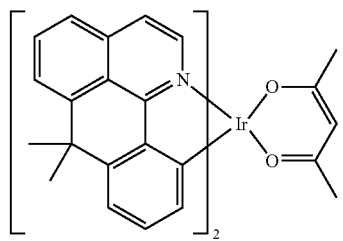 (40)
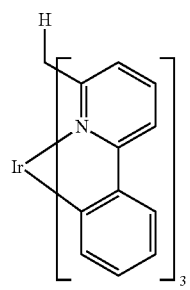 (41)
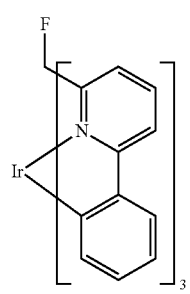 (42)
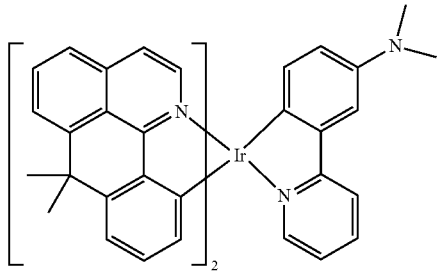 (43)
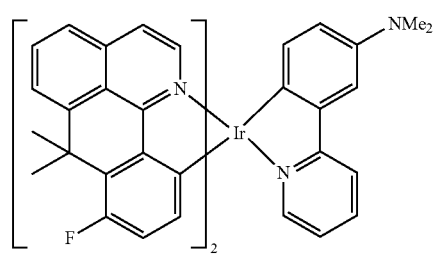 (44)
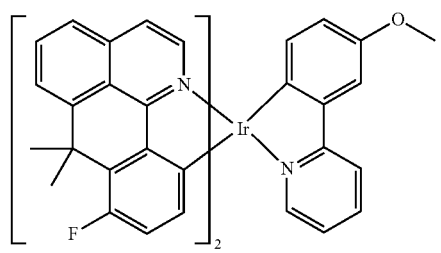 (45)
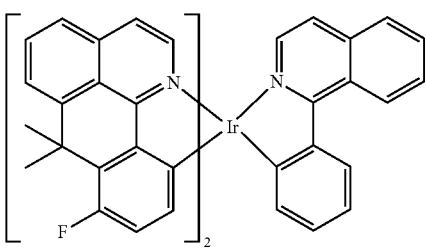 (46)
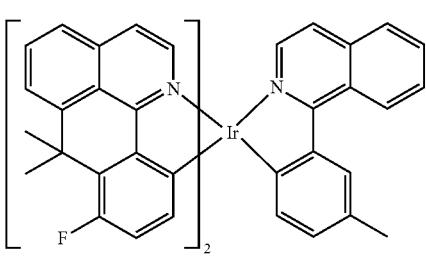 (47)
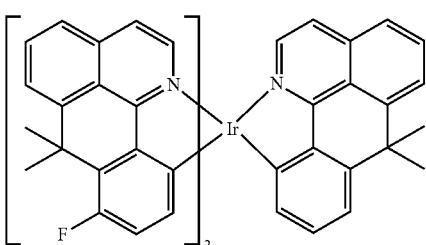 (48)
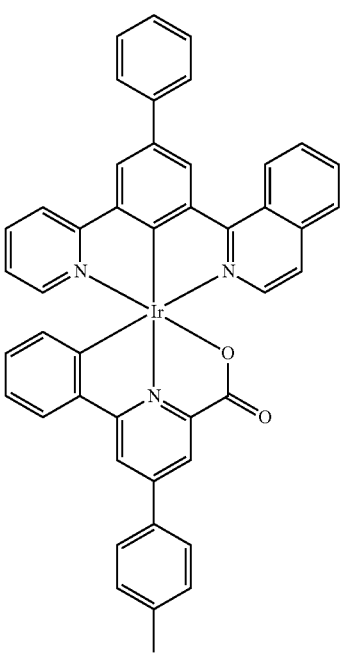 (49)

(50)
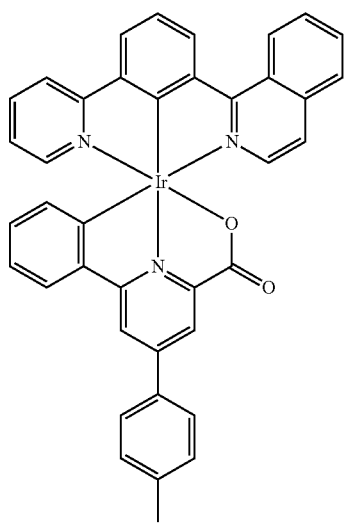
(51)
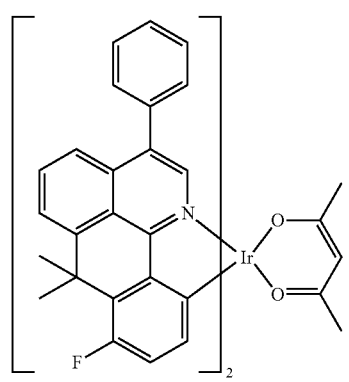
(52)
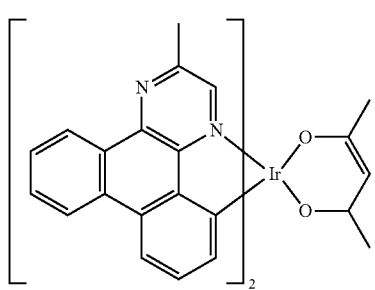
(53)
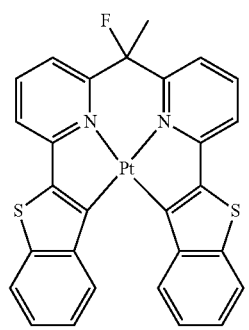
(54)
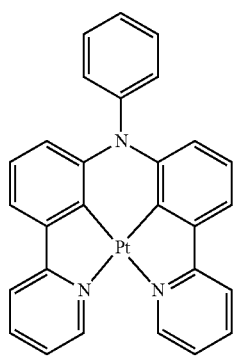
(55)
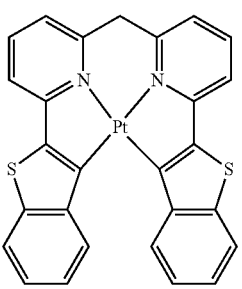
(56)
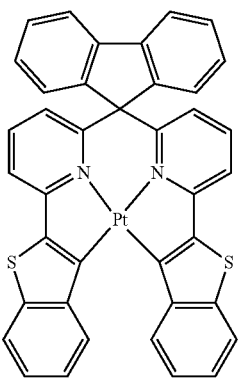
(57)
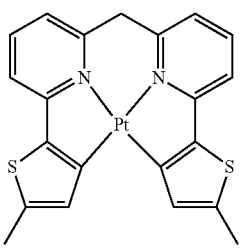
(58)
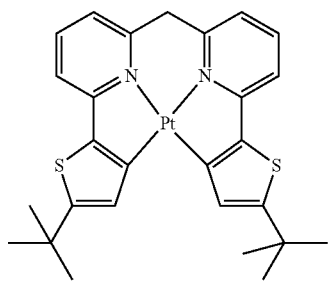

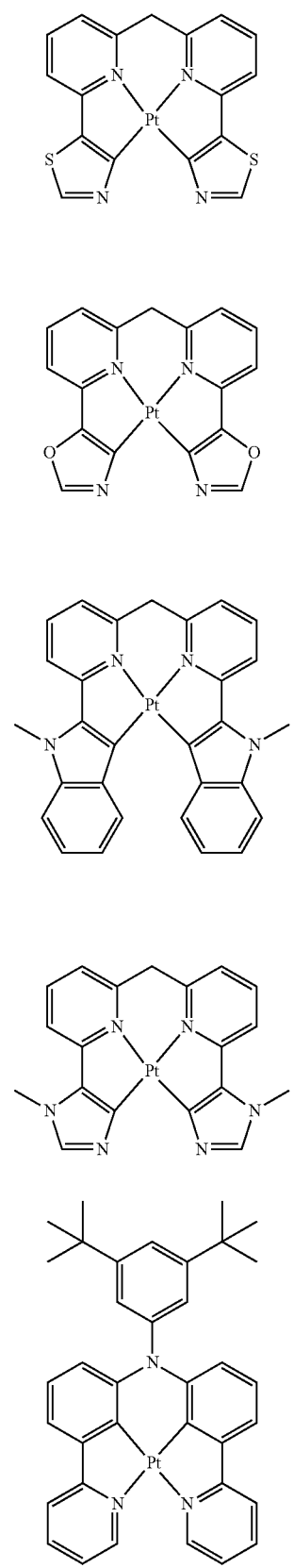
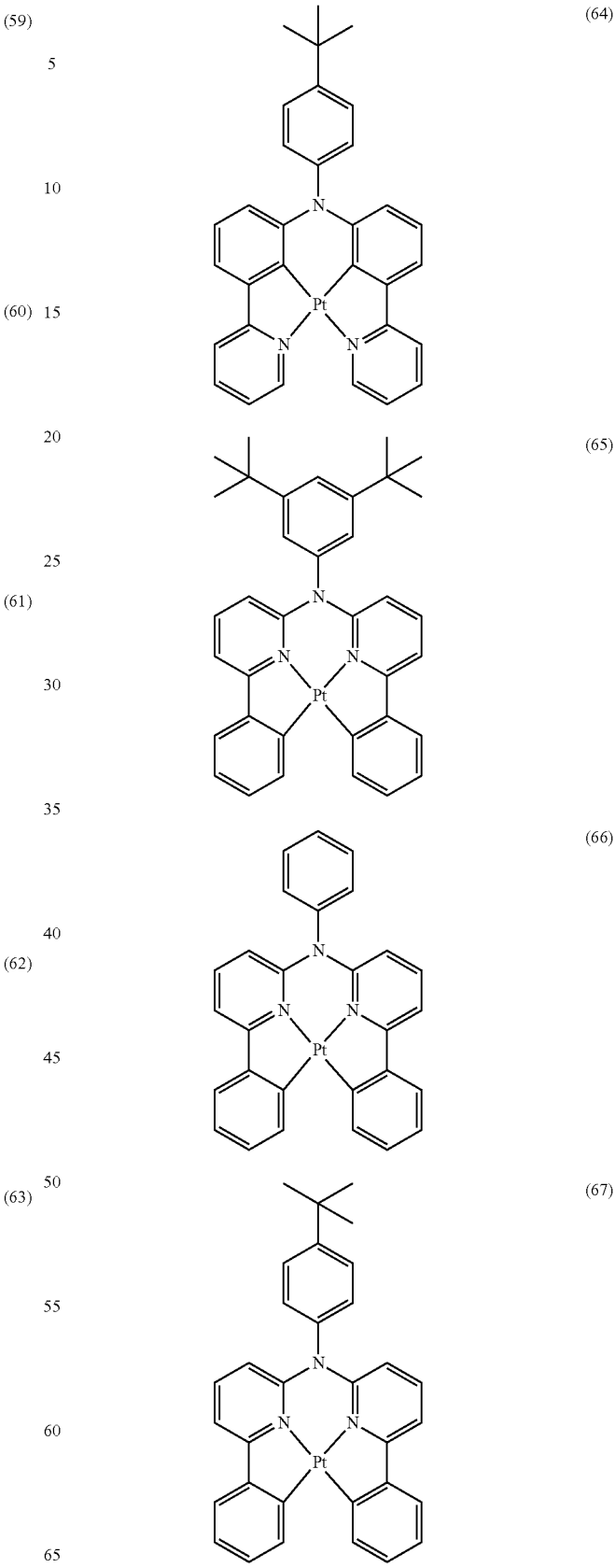

(68) 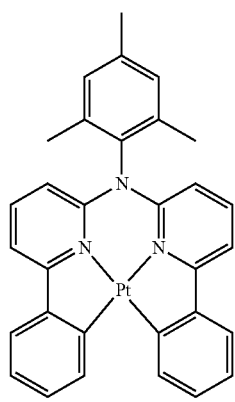
(69) 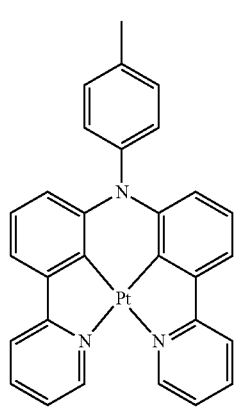
(70) 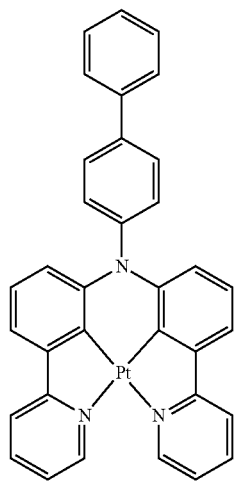
(71) 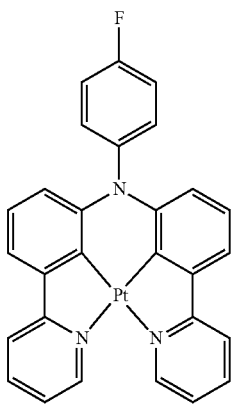
(72) 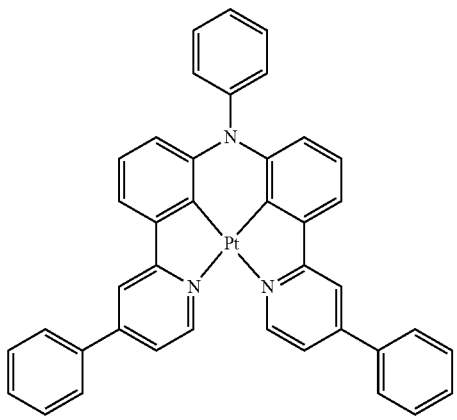
(73) 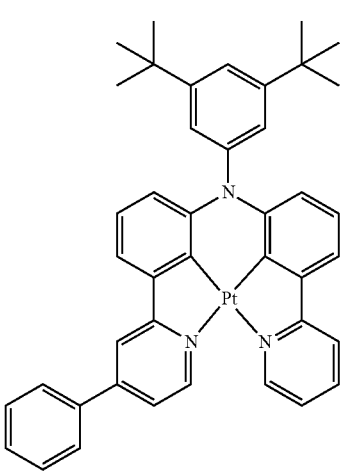

-continued
(74)
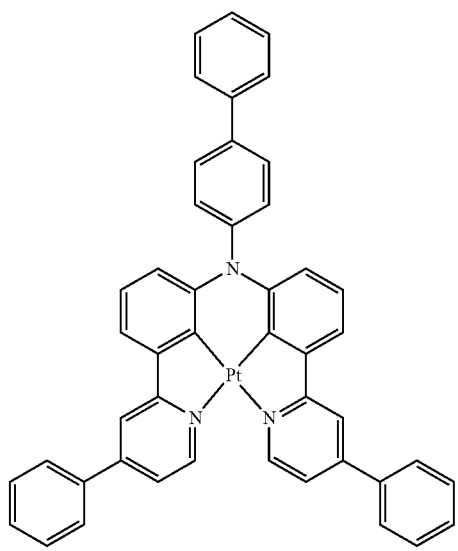
(75)
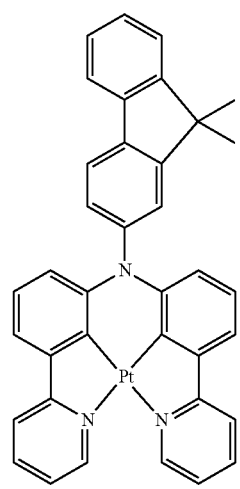
(76)
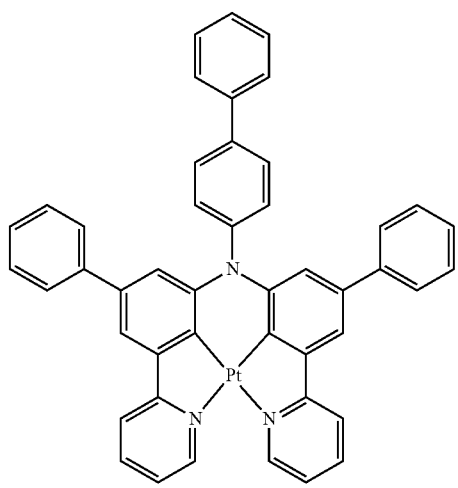
-continued
(77)
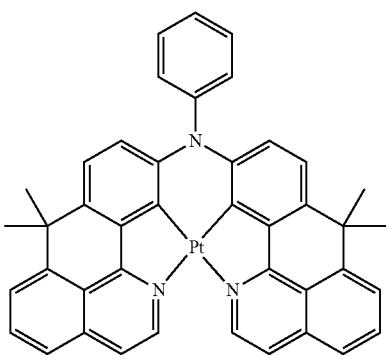
(78)
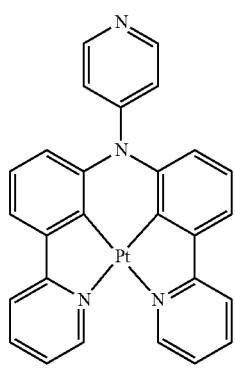
(79)
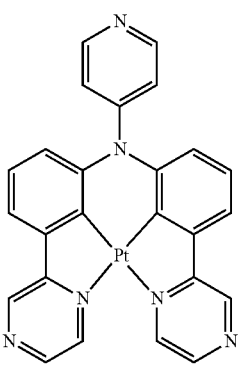
(80)
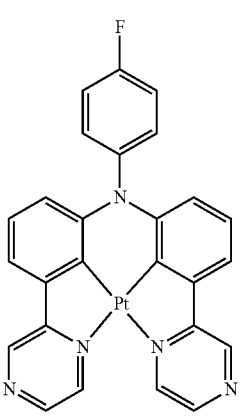

| 37 -continued | 38 -continued |
|---|---|
| (81) 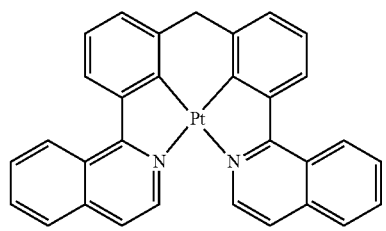 | (86) 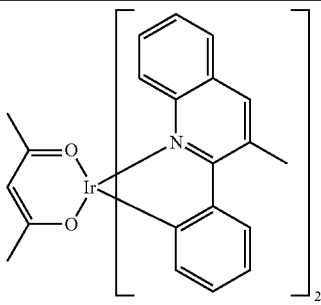 |
| (82) 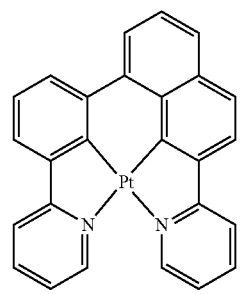 | (87) 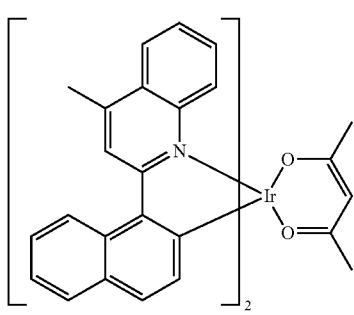 |
| (83) 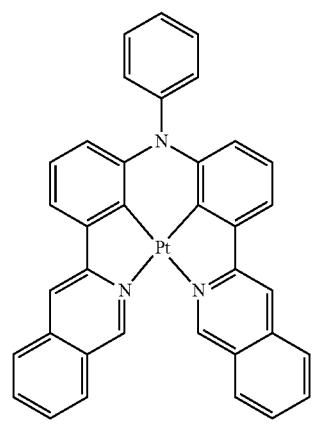 | (88) 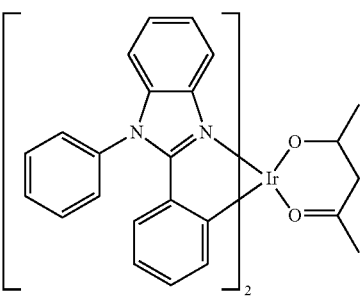 |
| (84) 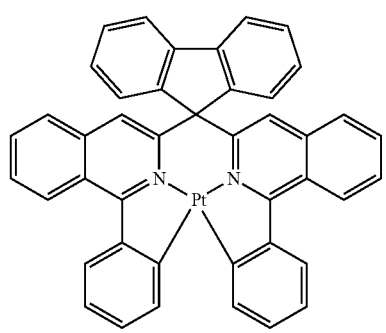 | (89) 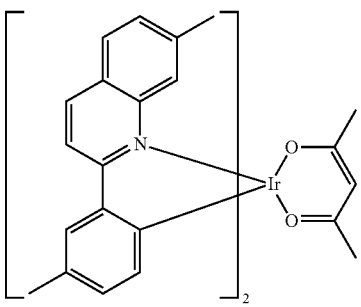 |
| (85) 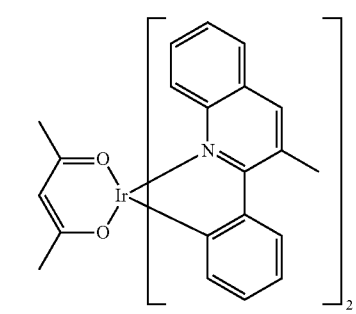 | (90) 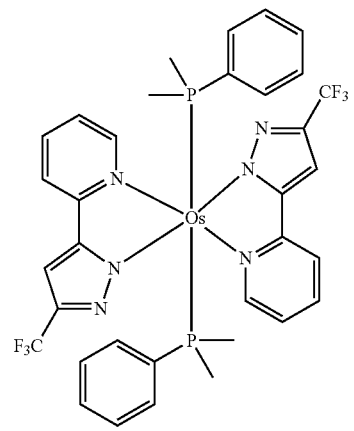 |

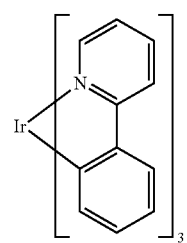 (91)
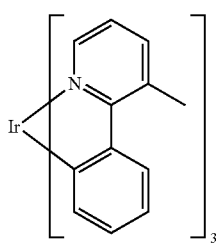 (92)
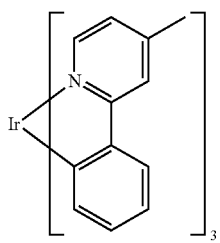 (93)
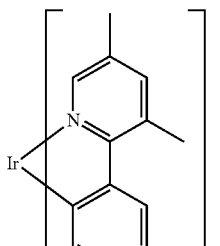 (94)
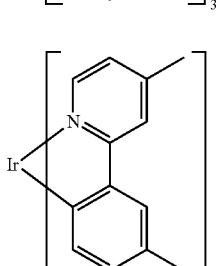 (95)
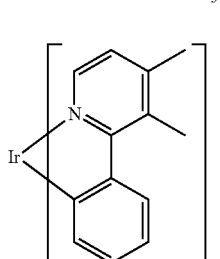 (96)
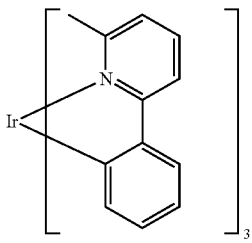 (97)
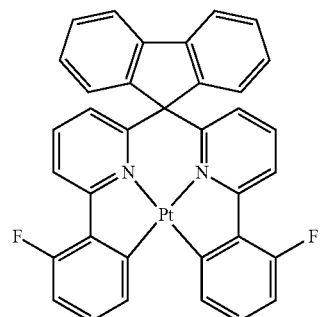 (98)
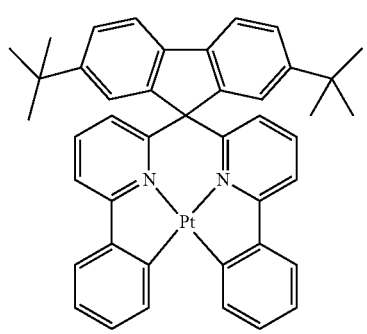 (99)
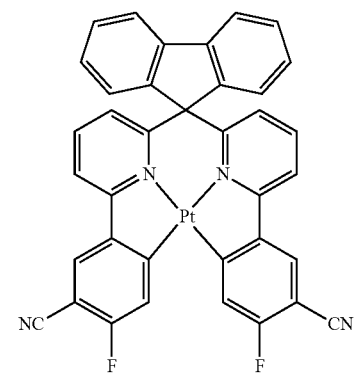 (100)
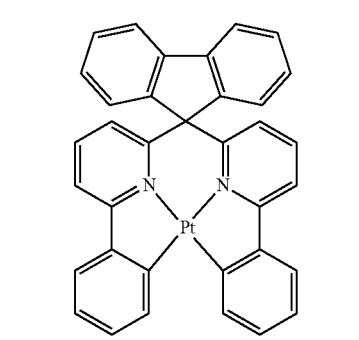 (101)

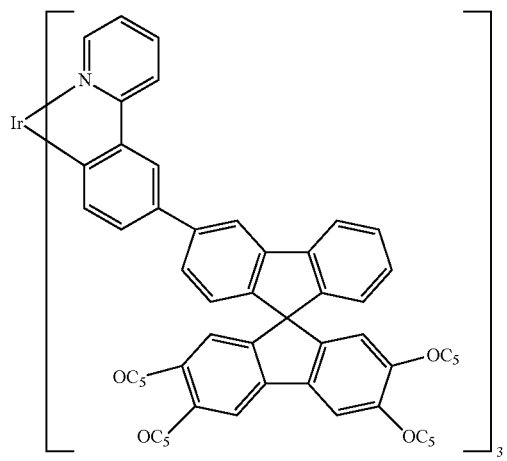
(102)
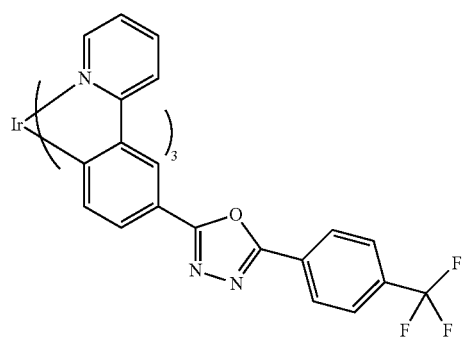
(103)
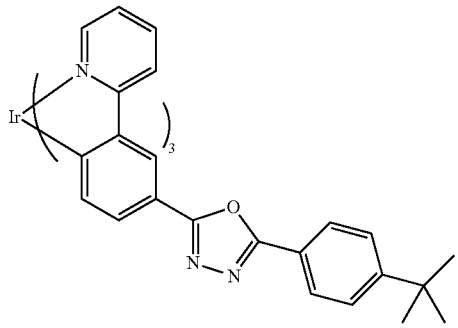
(104)
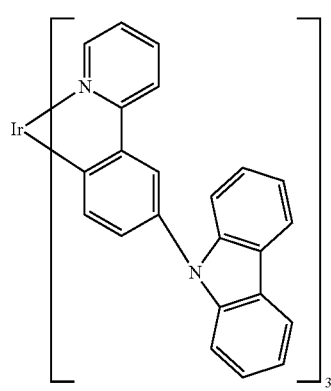
(105)
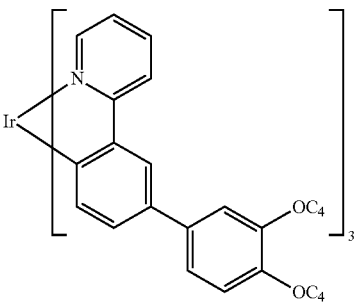
(106)
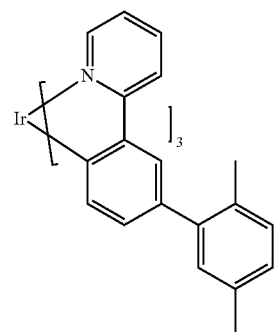
(107)
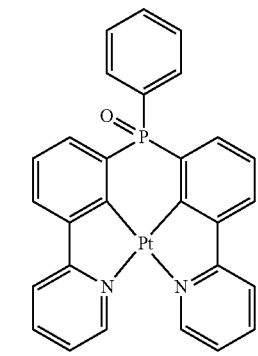
(108)
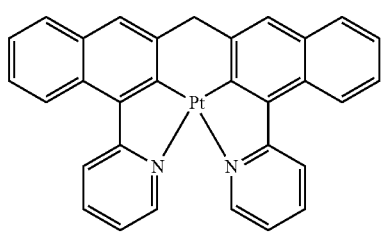
(109)
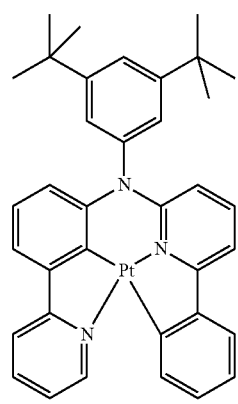
(110)

-continued
(111) 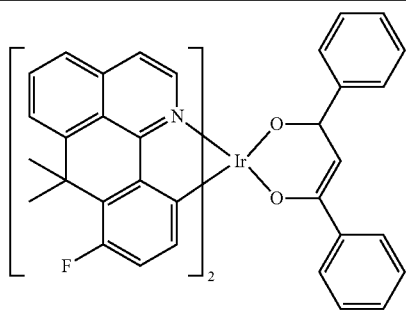
(112) 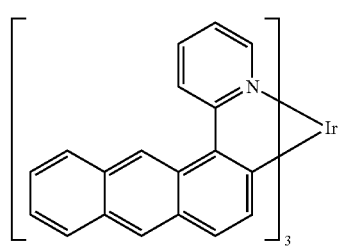
(113) 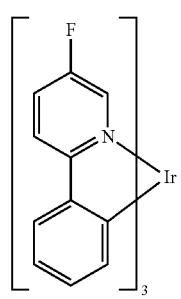
(114) 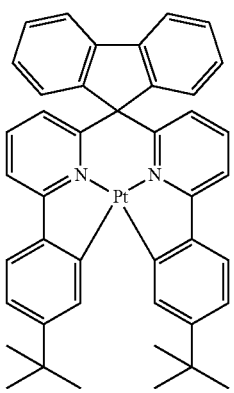
(115) 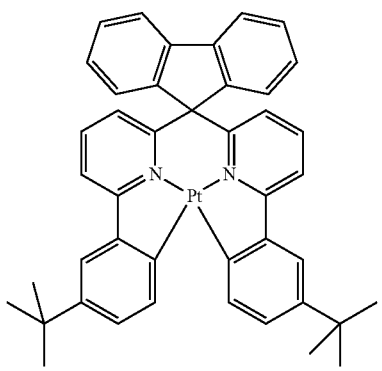
-continued
(116) 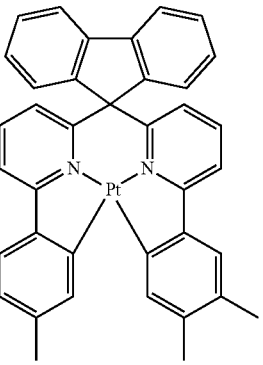
(117) 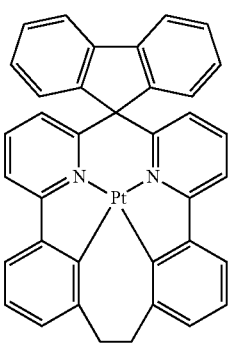
(118) 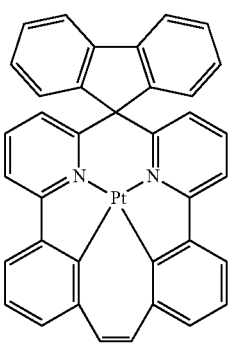
(119) 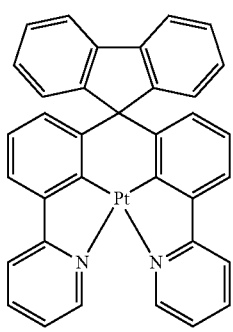

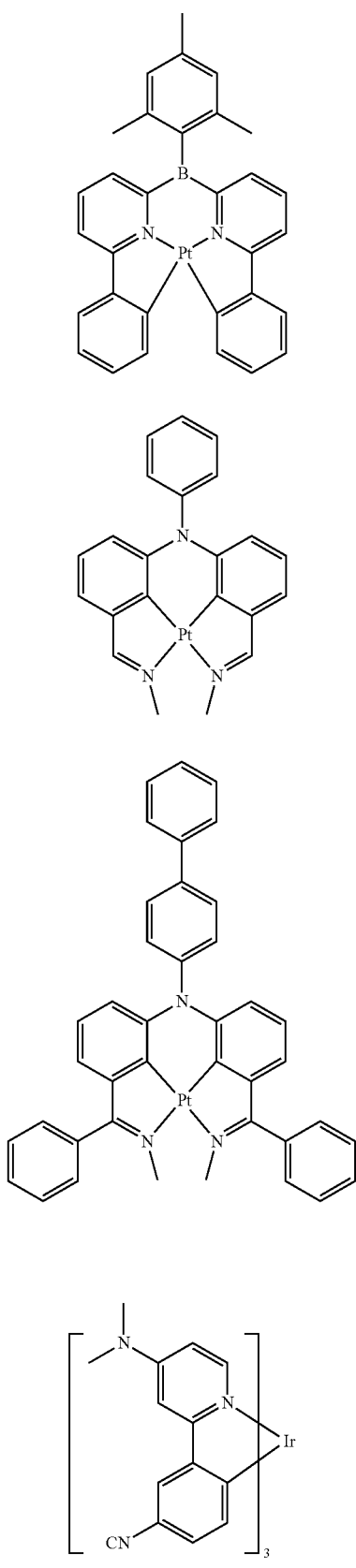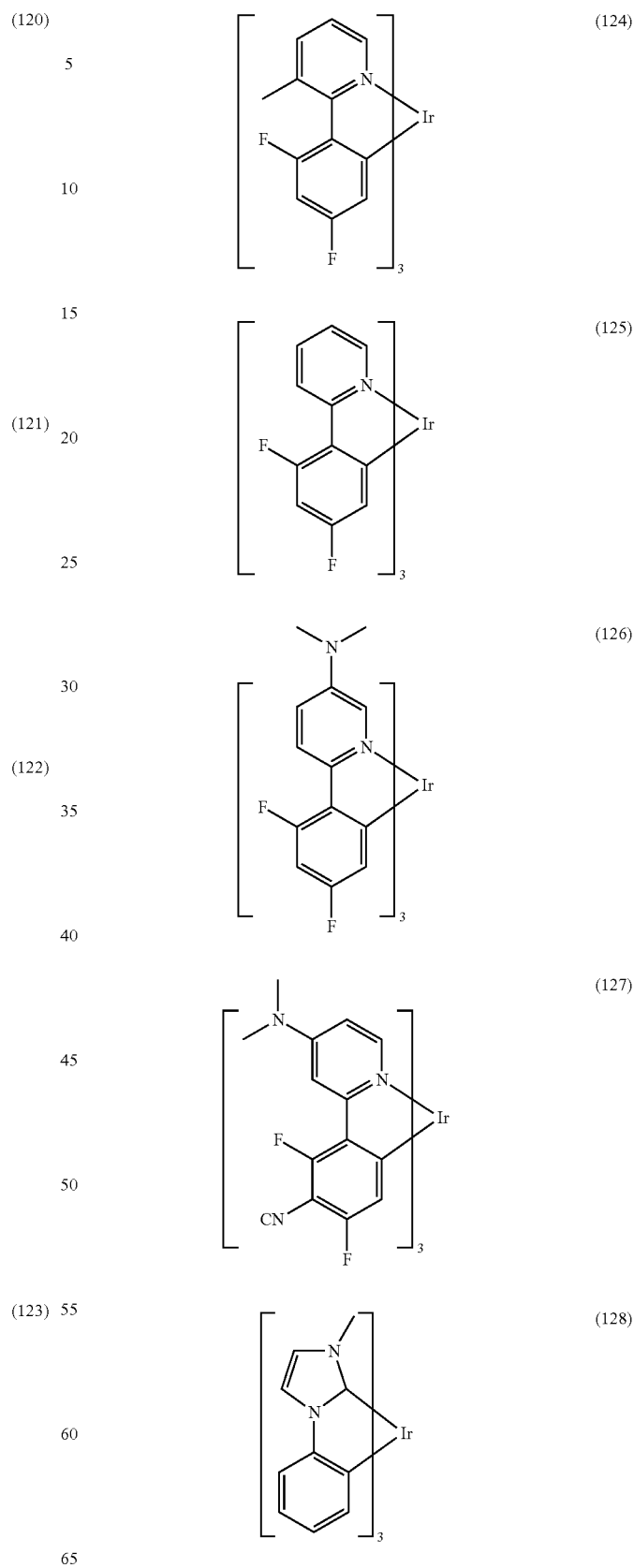

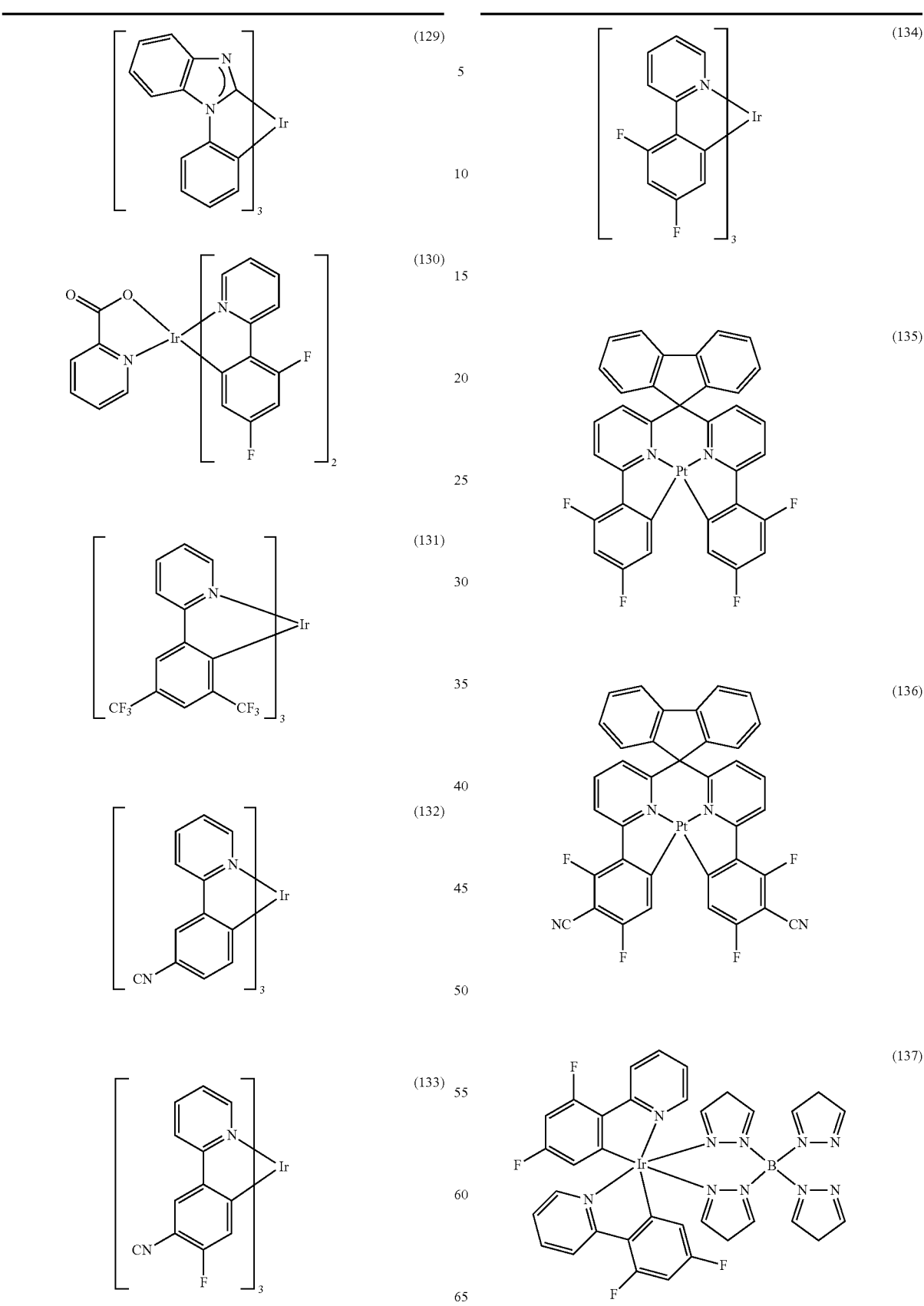

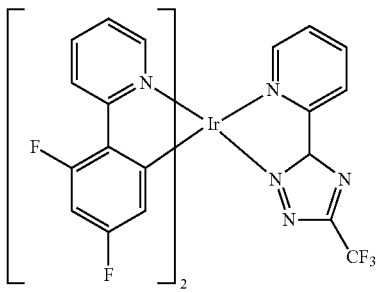

(138)

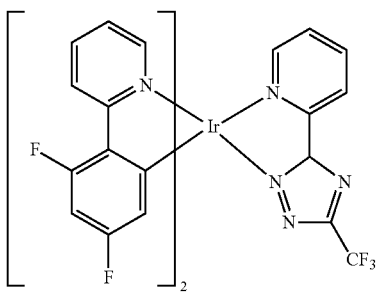

(139)

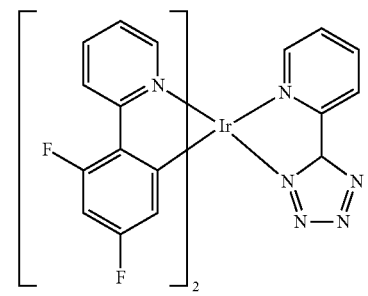

(140)

Preferred dopants are selected from the class of the monostyrylamines, the distyrylamines, the tristyrylamines, the tetrastyrylamines, the styrylphosphines, the styryl ethers and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. For the purposes of the present invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthraceneamines, aromatic anthracenediamines, aromatic pyreneamines, aromatic pyrenediamines, aromatic chryseneamines or aromatic chrysenediamines. An aromatic anthraceneamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyreneamines, pyrenediamines, chryseneamines and chrysenediamines are defined analogously thereto, where the diarylamino groups are preferably bonded to the pyrene in the 1-position or in the 1,6-position. Further preferred dopants are selected from indenofluoreneamines or indenofluorene-diamines, for example in accordance with WO 06/122630, benzoindenofluoreneamines or benzoindenofluorenediamines, for example in accordance with WO 08/006449, and dibenzoindenofluoreneamines or dibenzoindenofluorenediamines, for example in accordance with WO 07/140847. Examples of dopants from the class of the styrylamines are substituted or unsubstituted tristilbeneamines or the dopants described in WO 06/000388, WO 06/058737, WO 06/000389, WO 07/065549 and WO 07/115610. Preference is furthermore given to the condensed hydrocarbons disclosed in DE 102008035413.

Suitable dopants are furthermore the structures depicted in the following table, and the derivatives of these structures disclosed in JP 06/001973, WO 04/047499, WO 06/098080, WO 07/065678, US 2005/0260442 and WO 04/092111.

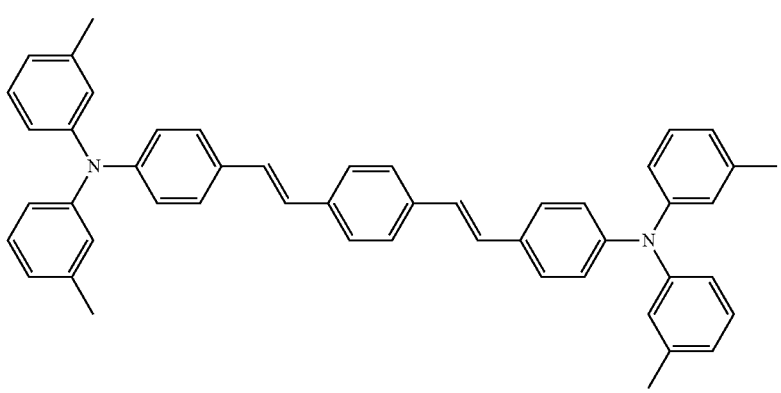 [SMILES: Cc1cccc(N(c2ccc(/C=C/c3ccc(/C=C/c4ccc(N(c5cccc(C)c5)c5cccc(C)c5)cc4)cc3)cc2)c2cccc(C)c2)c1]

(141)

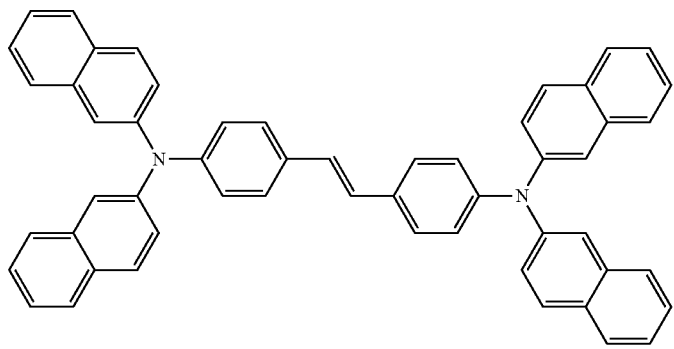 [SMILES: C(=C\c1ccc(N(c2ccc3ccccc3c2)c2ccc3ccccc3c2)cc1)/c1ccc(N(c2ccc3ccccc3c2)c2ccc3ccccc3c2)cc1]
(142)
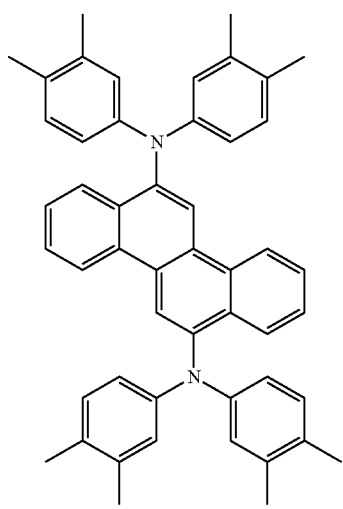
(143)
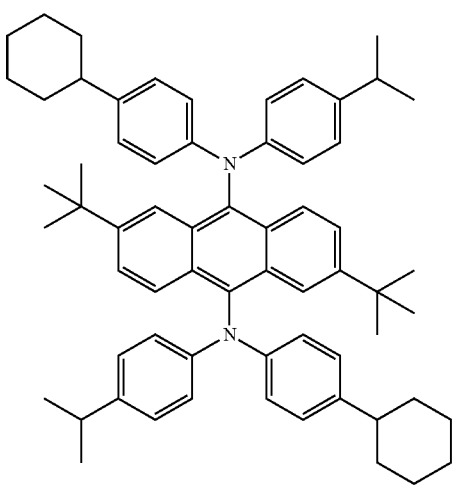 [SMILES: CC(C)c1ccc(N(c2ccc(C3CCCCC3)cc2)c2c3ccc(C(C)(C)C)cc3c(N(c3ccc(C(C)C)cc3)c3ccc(C4CCCCC4)cc3)c3ccc(C(C)(C)C)cc23)cc1]
(144)

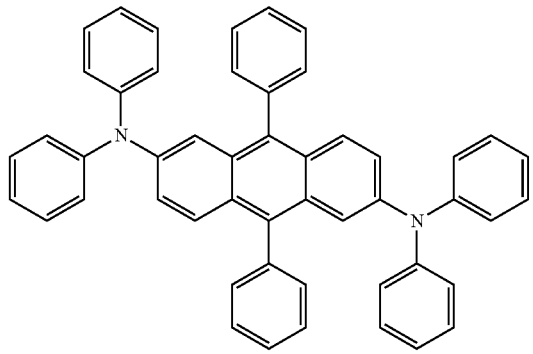 [SMILES: c1ccc(-c2c3ccc(N(c4ccccc4)c4ccccc4)cc3c(-c3ccccc3)c3ccc(N(c4ccccc4)c4ccccc4)cc23)cc1]

(145)

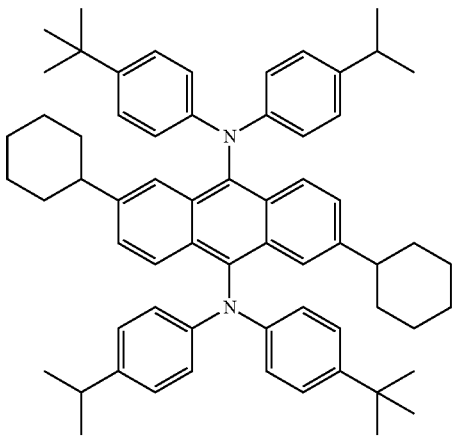 [SMILES: CC(C)c1ccc(N(c2ccc(C(C)(C)C)cc2)c2c3ccc(C4CCCCC4)cc3c(N(c3ccc(C(C)C)cc3)c3ccc(C(C)(C)C)cc3)c3ccc(C4CCCCC4)cc23)cc1]

(146)

The proportion of the dopant in the mixture of the emitting layer is between 0.1 and 50.0% by weight, preferably between 0.5 and 20.0% by weight, more preferably between 1.0 and 10.0% by weight. Correspondingly, the proportion of the host material is between 50.0 and 99.9% by weight, preferably between 80.0 and 99.5% by weight, more preferably between 90.0 and 99.0% by weight.

Suitable host materials for this purpose are materials from various classes of substance. Preferred host materials are selected from the classes of the oligoarylenes (for example 2,2',7,7-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052) or the benzanthracenes (for example in accordance with WO 08/145239).

Suitable host materials are furthermore also the benzo[c] phenanthrene compounds according to the invention which are described above. Apart from the compounds according to the invention, particularly preferred host materials are selected from the classes of the oligoarylenes containing naphthalene, anthracene, benzanthracene and/or pyrene or atropisomers of these compounds, the oligoarylenevinylenes, the ketones, the phosphine oxides and the sulfoxides. Apart from the benzo[c]phenanthrene compounds according to the invention, very particularly preferred host materials are selected from the classes of the oligoarylenes containing anthracene, benzanthracene and/or pyrene or atropisomers of these compounds. For the purposes of this invention, an oligoarylene is intended to be taken to mean a compound in which at least three aryl or arylene groups are bonded to one another.

Suitable host materials are furthermore, for example, the materials depicted in the following table, and derivatives of these materials, as disclosed in WO 04/018587, WO 08/006449, U.S. Pat. No. 5,935,721, US 2005/0181232, JP 2000/273056, EP 681019, US 2004/0247937 and US 2005/0211958.

(147)
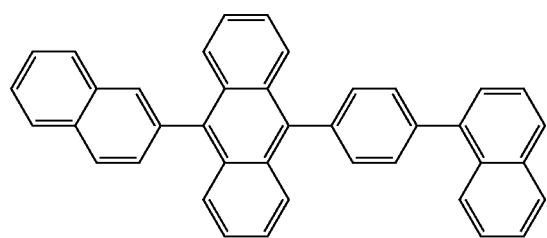 [SMILES: c1ccc2cc(-c3c4ccccc4c(-c4ccc(-c5cccc6ccccc56)cc4)c4ccccc34)ccc2c1]
(148)
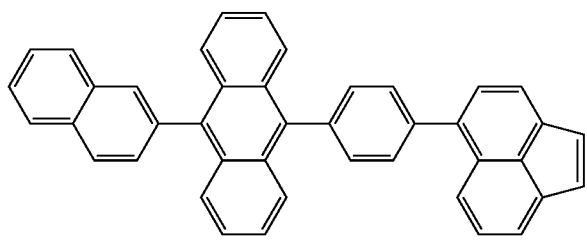 [SMILES: C1=Cc2ccc(-c3ccc(-c4c5ccccc5c(-c5ccc6ccccc6c5)c5ccccc45)cc3)c3cccc1c23]
(149)
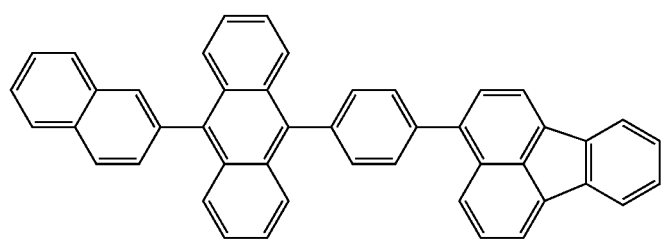 [SMILES: c1ccc2c(c1)-c1cccc3c(-c4ccc(-c5c6ccccc6c(-c6ccc7ccccc7c6)c6ccccc56)cc4)ccc-2c13]
(150)
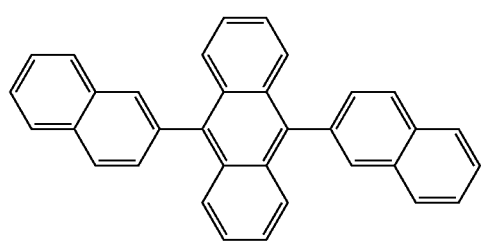 [SMILES: c1ccc2cc(-c3c4ccccc4c(-c4ccc5ccccc5c4)c4ccccc34)ccc2c1]
(151)
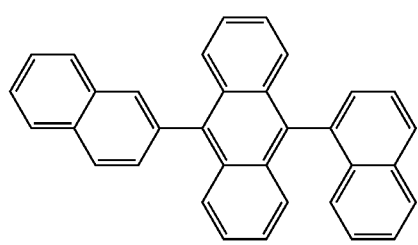 [SMILES: c1ccc2cc(-c3c4ccccc4c(-c4cccc5ccccc45)c4ccccc34)ccc2c1]
(152)
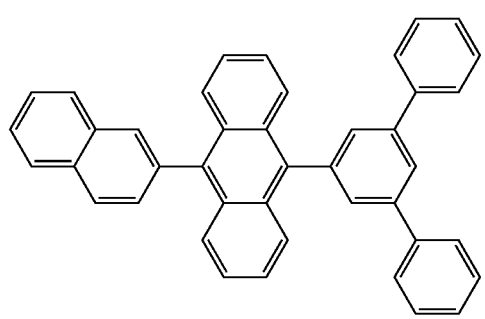 [SMILES: c1ccc(-c2cc(-c3ccccc3)cc(-c3c4ccccc4c(-c4ccc5ccccc5c4)c4ccccc34)c2)cc1]

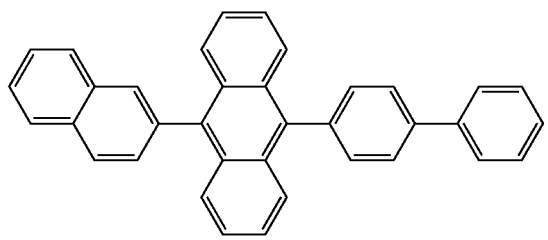 [SMILES: c1ccc(-c2ccc(-c3c4ccccc4c(-c4ccc5ccccc5c4)c4ccccc34)cc2)cc1]
(153)
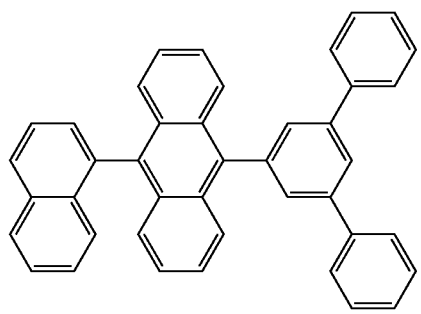 [SMILES: c1ccc(-c2cc(-c3ccccc3)cc(-c3c4ccccc4c(-c4cccc5ccccc45)c4ccccc34)c2)cc1]
(154)
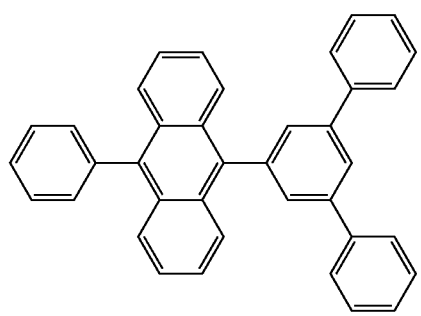 [SMILES: c1ccc(-c2cc(-c3ccccc3)cc(-c3c4ccccc4c(-c4ccccc4)c4ccccc34)c2)cc1]
(155)
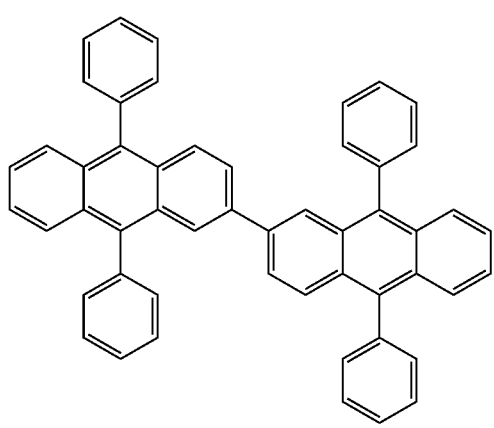 [SMILES: c1ccc(-c2c3ccccc3c(-c3ccccc3)c3cc(-c4ccc5c(-c6ccccc6)c6ccccc6c(-c6ccccc6)c5c4)ccc23)cc1]
(156)
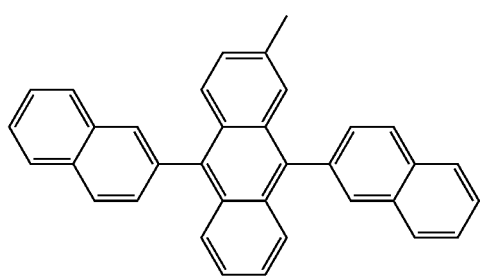 [SMILES: Cc1ccc2c(-c3ccc4ccccc4c3)c3ccccc3c(-c3ccc4ccccc4c3)c2c1]
(157)

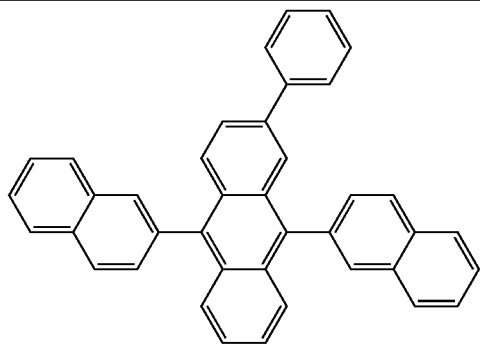

(158)

For the purposes of this invention, a hole-injection layer is a layer which is directly adjacent to the anode. For the purposes of this invention, a hole-transport layer is a layer which is located between a hole-injection layer and an emission layer. It may be preferred for them to be doped with electron-acceptor compounds, for example with $F_4$-TCNQ or with compounds as described in EP 1476881 or EP 1596445.

Apart from the materials according to the invention, suitable charge-transport materials, as can be used in the hole-injection or hole-transport layer or in the electron-injection or electron-transport layer of the organic electroluminescent device according to the invention, are, for example, the compounds disclosed in Y. Shirota et al., *Chem. Rev.* 2007, 107(4), 953-1010, or other materials as employed in these layers in accordance with the prior art.

Examples of preferred hole-transport materials which can be used in a hole-transport or hole-injection layer of the electroluminescent device according to the invention are indenofluoreneamines and derivatives (for example in accordance with WO 06/122630 or WO 06/100896), the amine derivatives as disclosed in EP 1661888, hexaazatriphenylene derivatives (for example in accordance with WO 01/049806), amine derivatives with condensed aromatics (for example in accordance with U.S. Pat. No. 5,061,569), the amine derivatives as disclosed in WO 95/09147, monobenzoindenofluoreneamines (for example in accordance with WO 08/006449) or dibenzoindenofluoreneamines (for example in accordance with WO 07/140847). Suitable hole-transport and hole-injection materials are furthermore derivatives of the compounds depicted above, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569.

Suitable hole-transport or hole-injection materials are furthermore, for example, the materials indicated in the following table.

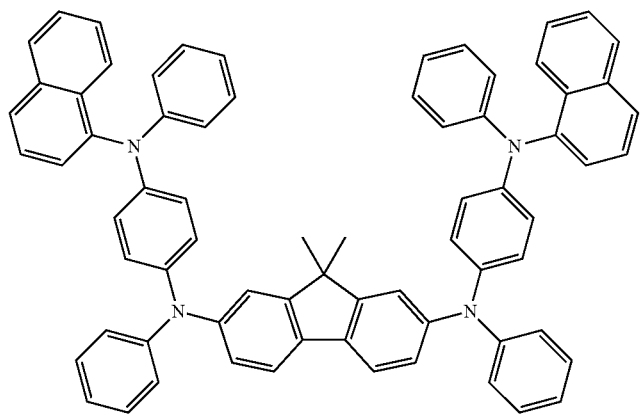 [SMILES: CC1(C)c2cc(N(c3ccccc3)c3ccc(N(c4ccccc4)c4cccc5ccccc45)cc3)ccc2-c2ccc(N(c3ccccc3)c3ccc(N(c4ccccc4)c4cccc5ccccc45)cc3)cc21]

(159)

-continued
(160)
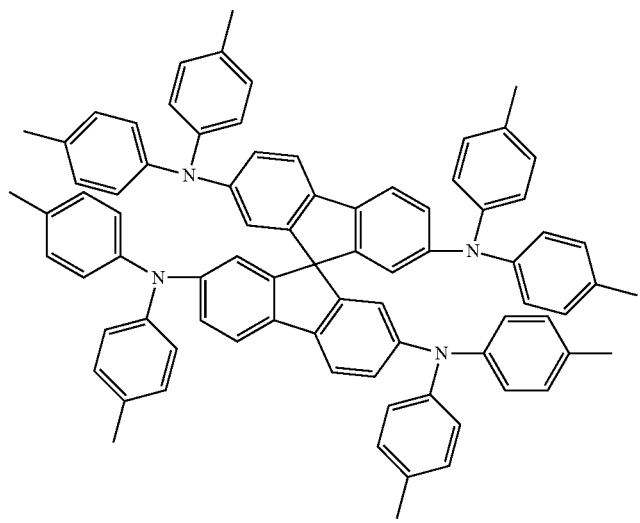
(161)
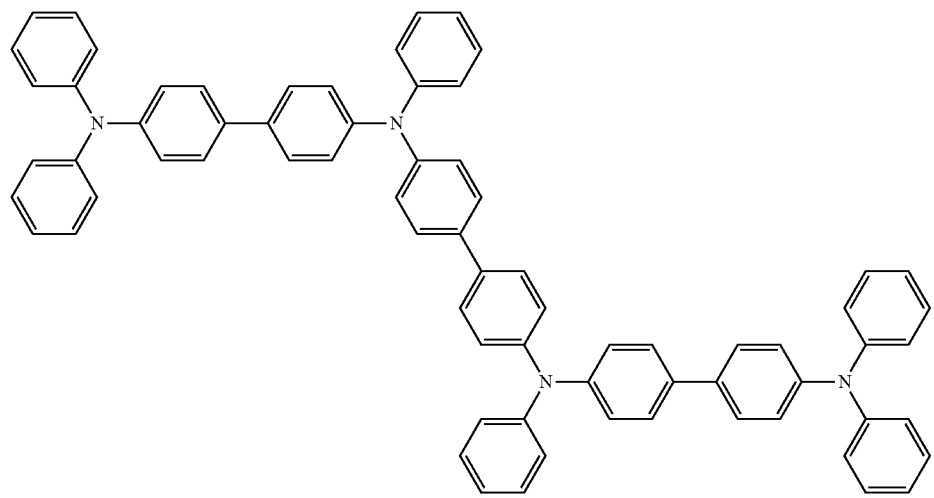 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]
(162)
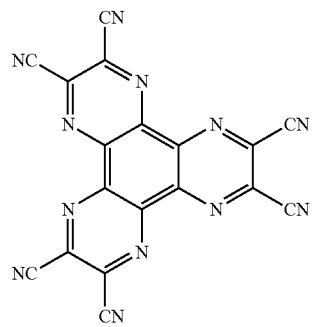 [SMILES: N#Cc1nc2c3nc(C#N)c(C#N)nc3c3nc(C#N)c(C#N)nc3c2nc1C#N]

-continued
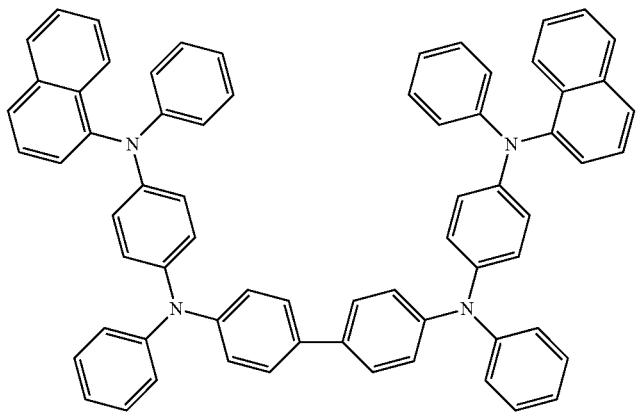 [SMILES: c1ccc(N(c2ccc(-c3ccc(N(c4ccccc4)c4ccc(N(c5ccccc5)c5cccc6ccccc56)cc4)cc3)cc2)c2ccc(N(c3ccccc3)c3cccc4ccccc34)cc2)cc1]
(163)
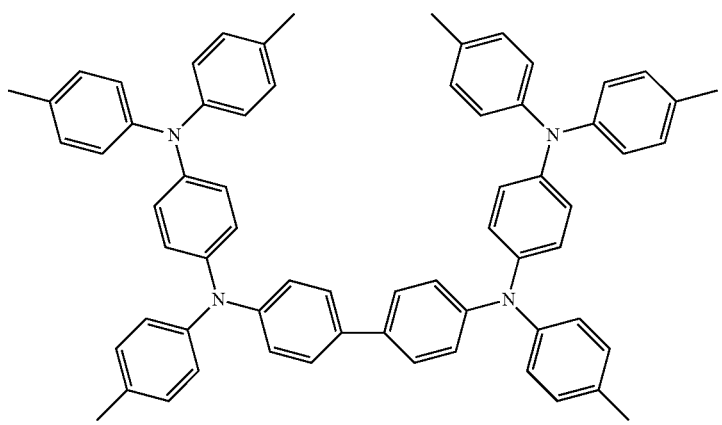
(164)
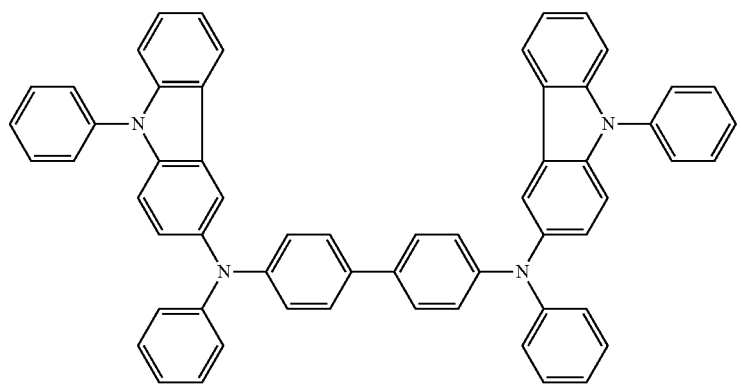 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]
(165)
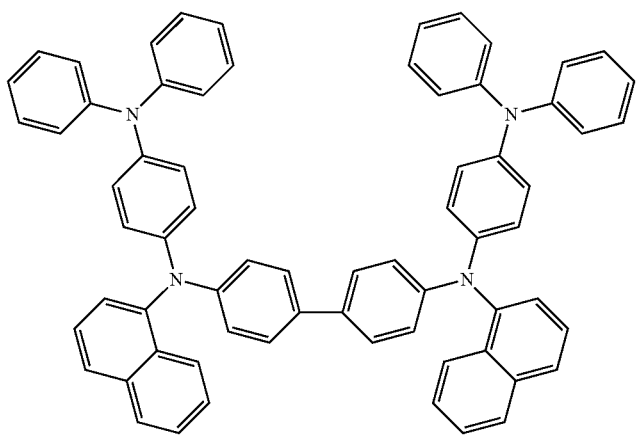 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
(166)

-continued
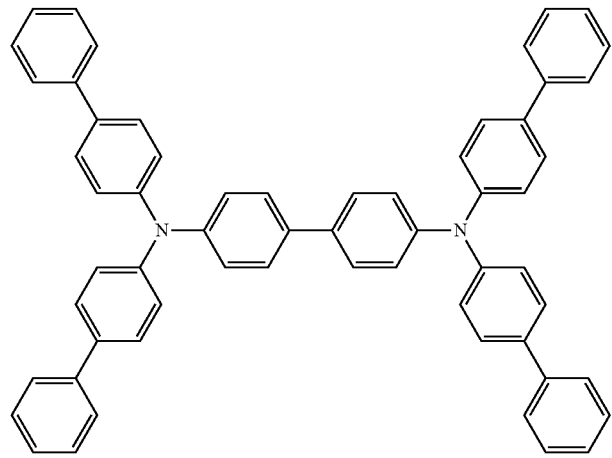 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
(167)
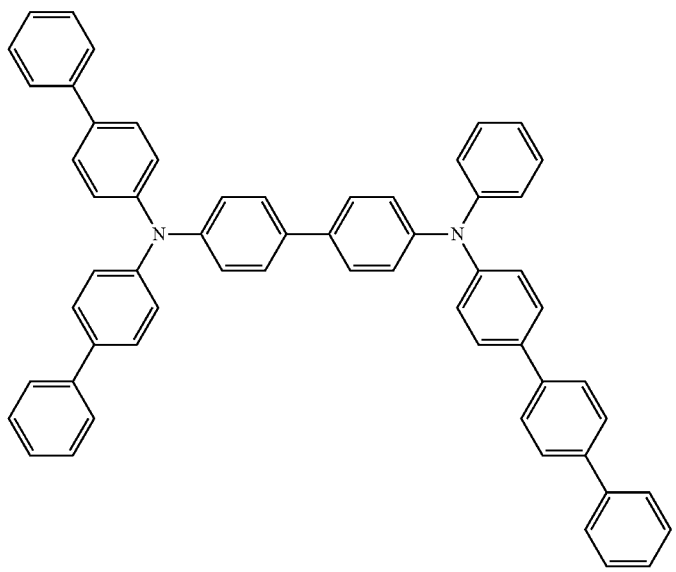 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
(168)
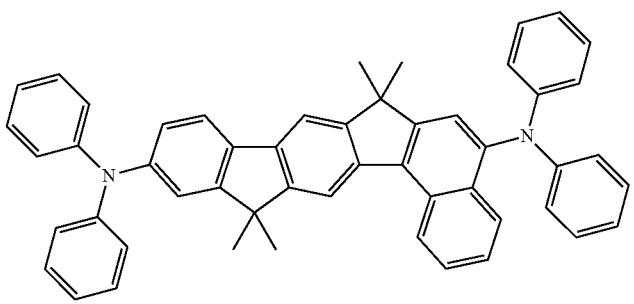 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]
(169)
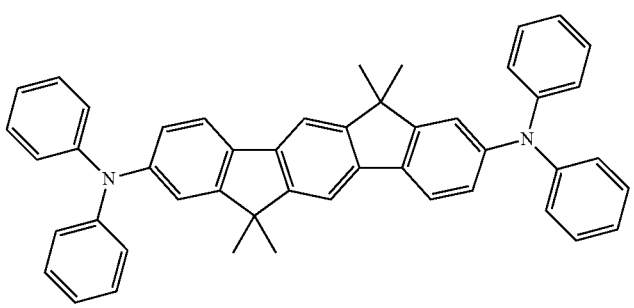 [SMILES: CC1(C)c2cc(N(c3ccccc3)c3ccccc3)ccc2-c2cc3c(cc21)-c1ccc(N(c2ccccc2)c2ccccc2)cc1C3(C)C]
(170)

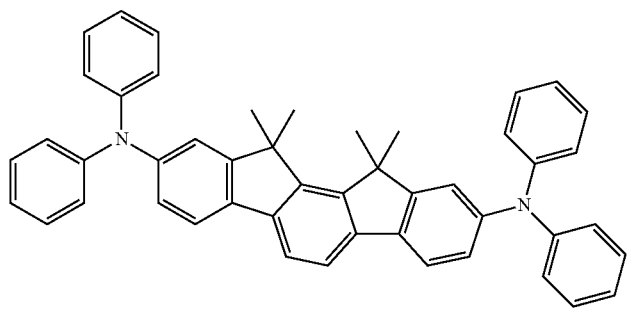 [SMILES: CC1(C)c2cc(N(c3ccccc3)c3ccccc3)ccc2-c2ccc3c(c21)C(C)(C)c1cc(N(c2ccccc2)c2ccccc2)ccc1-3]
(171)
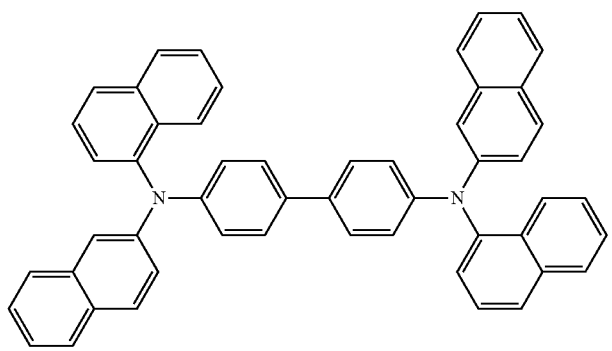 [SMILES: c1ccc2cc(N(c3ccc(-c4ccc(N(c5ccc6ccccc6c5)c5cccc6ccccc56)cc4)cc3)c3cccc4ccccc34)ccc2c1]
(172)
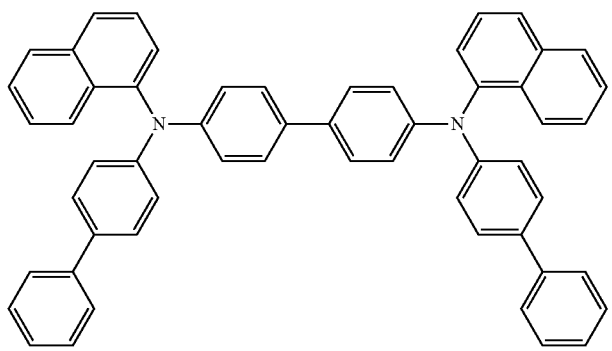 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]
(173)
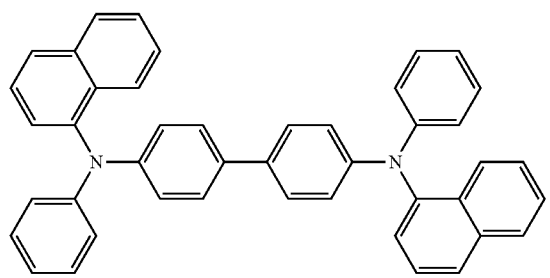 [SMILES: c1ccc(N(c2ccc(-c3ccc(N(c4ccccc4)c4cccc5ccccc45)cc3)cc2)c2cccc3ccccc23)cc1]
(174)

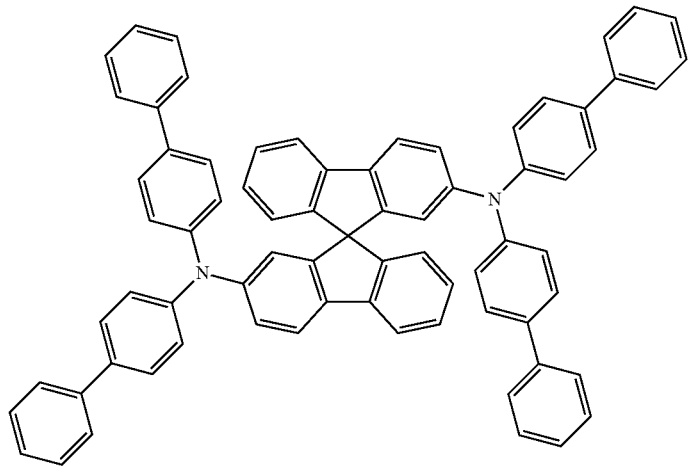 [SMILES: c1ccc(-c2ccc(N(c3ccc(-c4ccccc4)cc3)c3ccc4c(c3)C3(c5ccccc5-4)c4ccccc4-c4ccc(N(c5ccc(-c6ccccc6)cc5)c5ccc(-c6ccccc6)cc5)cc43)cc2)cc1]

(175)

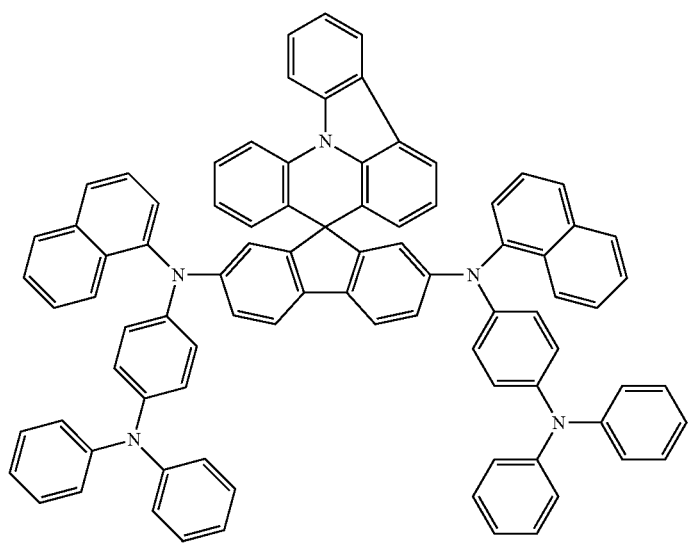 [SMILES: c1ccc(N(c2ccccc2)c2ccc(N(c3ccc4c(c3)C3(c5cc(N(c6ccc(N(c7ccccc7)c7ccccc7)cc6)c6cccc7ccccc67)ccc5-4)c4ccccc4-n4c5ccccc5c5cccc3c54)c3cccc4ccccc34)cc2)cc1]

(176)

Suitable electron-transport or electron-injection materials which can be used in the electroluminescent device according to the invention are, for example, the materials indicated in the following table. Suitable electron-transport and electron-injection materials are furthermore derivatives of the compounds depicted above, as disclosed in JP 2000/053957, WO 03/060956, WO 04/028217 and WO 04/080975.

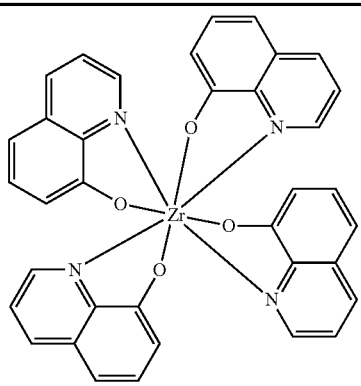

(177)

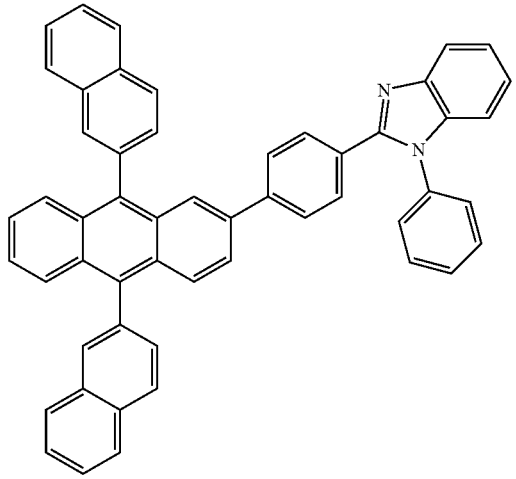 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

(178)

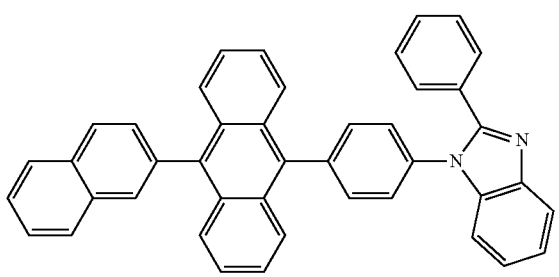 [SMILES: c1ccc(-c2nc3ccccc3n2-c2ccc(-c3c4ccccc4c(-c4ccc5ccccc5c4)c4ccccc34)cc2)cc1]

(179)

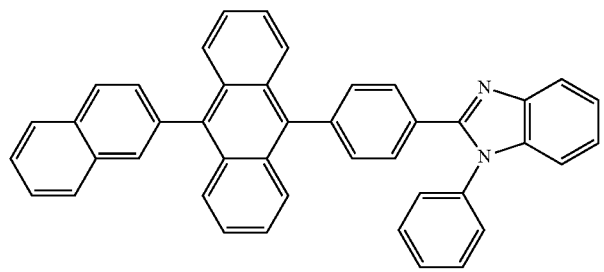 [SMILES: c1ccc(-n2c(-c3ccc(-c4c5ccccc5c(-c5ccc6ccccc6c5)c5ccccc45)cc3)nc3ccccc32)cc1]

(180)

Suitable matrix materials for the compounds according to the invention are ketones, phosphine oxides, sulfoxides and sulfones, for example in accordance with WO 04/013080, WO 04/093207, WO 06/005627 or DE 102008033943, triarylamines, carbazole derivatives, for example CBP (N,N-biscarbazolyl-biphenyl) or the carbazole derivatives disclosed in WO 05/039246, US 2005/0069729, JP 2004/288381, EP 1205527 or WO 08/086851, indolocarbazole derivatives, for example in accordance with WO 07/063754 or WO 08/056746, azacarbazoles, for example in accordance with EP 1617710, EP 1617711, EP 1731584 or JP 2005/347160, bipolar matrix materials, for example in accordance with WO 07/137725, silanes, for example in accordance with WO 05/111172, azaboroles or boronic esters, for example in accordance with WO 06/117052, triazine derivatives, for example in accordance with DE 102008036982, WO 07/063754 or WO 08/056746, or zinc complexes, for example in accordance with DE 102007053771.

Preference is furthermore also given to solutions of non-conducting, electronically inert polymers (matrix polymers; inert polymeric binders) which comprise admixed low-molecular-weight, oligomeric, dendritic, linear or branched and/or polymeric organic and/or organometallic semiconductors. Preferably, the composition may comprise 0.5 to 10% by weight inert polymeric binders.

Optionally, the OSC composition comprises one or more organic binders, preferably polymeric binders to adjust the rheological properties, as described for example in WO 2005/055248 A1, in particular an organic binder which has a low permittivity ($\varepsilon$) at 1,000 Hz of 3.3 or less, very preferably in a proportion of binder to OSC compounds from 20:1 to 1:20, preferably 10:1 to 1:10, more preferably 5:1 to 1:5, most preferably 1:2 to 1:5 by weight.

The binder is selected for example from poly($\alpha$-methylstyrene), polyvinylcinnamate, poly(4-vinylbiphenyl) or poly(4-methylstyrene), or blends thereof. The binder may also be a semiconducting binder selected for example from polyarylamines, polyfluorenes, polythiophenes, polyspirobifluorenes, substituted polyvinylenephenylenes, polycarbazoles or polystilbenes, or copolymers thereof.

According to a preferred embodiment of the present invention, an inert binder is a polymer having a glass transition temperature in the range of −70 to 160° C., preferably 0 to 150° C., more preferably 50 to 140° C. and most preferably 70 to 130° C. The glass transition temperature can be determined by measuring the DSC of the polymer (DIN EN ISO 11357, heating rate 10° C. per minute).

The composition according to the present invention may additionally comprise one or more further components like for example surface-active compounds, lubricating agents, conductive additives, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. However, these further components should not be oxidising or otherwise capable of chemically reacting with the OSC or have an electrically doping effect on the OSC.

Surprising improvements can be achieved with volatile wetting agents. The term "volatile" as used above and below means that the agent can be removed from the organic semiconducting materials by evaporation, after these materials have been deposited onto a substrate of an OE device, under conditions (like temperature and/or reduced pressure) that do not significantly damage these materials or the OE device. Preferably this means that the wetting agent has a boiling point or sublimation temperature of <350° C., more preferably ≤300° C., most preferably ≤250° C., at the pressure employed, very preferably at atmospheric pressure (1013 hPa). Evaporation can also be accelerated e.g. by applying heat and/or reduced pressure. Preferably, the wetting agents are not capable of chemically reacting with the OSC compounds. In particular they are selected from compounds that do not have a permanent doping effect on the OSC material (e.g. by oxidising or otherwise chemically reacting with the OSC material). Therefore, the formulation preferably should not contain additives, like e.g. oxidants or protonic or lewis acids, which react with the OSC materials by forming ionic products.

Surprising effects can be accomplished by compositions comprising volatile components having similar boiling points. Preferably, the difference of the boiling point of the wetting agent and the organic solvent is in the range of −50° C. to 50° C., more preferably in the range of −30° C. to 30° C. and most preferably in the range of −20° C. to 20° C.

Preferred wetting agents are non-aromatic compounds. With further preference the wetting agents are non-ionic compounds. Particular useful wetting agents comprise a surface tension of at most 35 mN/m, preferably of at most 30 mN/m, and more preferably of at most 25 mN/m. The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

According to a special aspect of the present invention, the difference of the surface tension of the organic solvent and the wetting agent is preferably at least 1 mN/m, preferably at least 5 mN/m and more preferably at least 10 mN/m.

Unexpected improvements can be achieved by wetting agents comprising a molecular weight of at least 100 g/mol, preferably at least 150 g/mol, more preferably at least 180 g/mol and most preferably at least 200 g/mol.

Suitable and preferred wetting agents that do not oxidise or otherwise chemically react with the OSC materials are selected from the group consisting of siloxanes, alkanes, amines, alkenes, alkynes, alcohols and/or halogenated derivates of these compounds. Furthermore, fluoroethers, fluoroesters and/or fluoroketones can be used. More preferably, these compounds are selected from methylsiloxanes having 6 to 20 carbon atoms, especially 8 to 16 carbon atoms; $C_7$-$C_{14}$ alkanes, $C_7$-$C_{14}$ alkenes, $C_7$-$C_{14}$ alkynes, alcohols having 7 to 14 carbon atoms, fluoroethers having 7 to 14 carbon atoms, fluoroesters having 7 to 14 carbon atoms and fluoroketones having 7 to 14 carbon atoms. Most preferred wetting agents are methylsiloxanes having 8 to 14 carbon atoms.

Useful and preferred alkanes having 7 to 14 carbon atoms include heptane, octane, nonane, decane, undecane, dodecane, tridecane, tetradecane, 3-methylheptane, 4-ethylheptane, 5-propyldecane, trimethylcyclohexane and decalin.

Halogenated alkanes having 7 to 14 carbon atoms include 1-chloroheptane, 1,2-dichlorooctane, tetrafluorooctane, decafluorododecane, perfluorononane, 1,1,1-trifluoromethyldecane, and perfluoromethyldecalin.

Useful and preferred alkenes having 7 to 14 carbon atoms include heptene, octene, nonene, 1-decene, 4-decene, undecene, dodecene, tridecene, tetradecene, 3-methylheptene, 4-ethylheptene, 5-propyldecene, and trimethylcyclohexene.

Halogenated alkenes having 7 to 14 carbon atoms include 1,2-dichlorooctene, tetrafluorooctene, decafluorododecene, perfluorononene, and 1,1,1-trifluoromethyldecene.

Useful and preferred alkynes having 7 to 14 carbon atoms include octyne, nonyne, 1-decyne, 4-decyne, dodecyne, tetradecyne, 3-methylheptyne, 4-ethylheptyne, 5-propyldecyne, and trimethylcyclohexyne.

Halogenated alkynes having 7 to 14 carbon atoms include 1,2-dichlorooctyne, tetrafluorooctyne, decafluorododecyne, perfluorononyne, and 1,1,1-trifluoromethyldecyne.

Useful and preferred alcanols having 7 to 14 carbon atoms include, heptanol, octanol, nonanol, decanol, undecanol, dodecanol, tridecanol, tetradecanol, 3-methylheptanol, 3,5-dimethyl-1-hexyn-3-ol, 4-ethyl-heptanol, 5-propyldecanol, trimethylcyclohexanol and hydroxydecalin.

Halogenated alkanols having 7 to 14 carbon atoms include 1-chloro-heptanol, 1,2-dichlorooctanol, tetrafluorooctanol, decafluorododecanol, perfluorononanol, 1,1,1-trifluoromethyldecanol, and 2-trifluoromethyl-1-hydroxydecalin.

Useful and preferred fluoroethers having 7 to 14 carbon atoms include 3-ethoxy-1,1,1,2,3,4,4,5,5,6,6,6 dodecafluoro-2-trifluoromethylhexane, 3-propoxy-1,1,1,2,3,4,4,5,5,6,6,6 dodecafluoro-2-trifluoromethylhexane, and 3-propoxy-1,1,1,2,3,4,4,5,5,5 decafluoro-2-trifluoromethylpentane.

Useful and preferred fluoroesters having 7 to 14 carbon atoms include 3-(1,1,1,2,3,4,4,5,5,6,6,6 dodecafluoro-2-trifluoromethylhexyl) ethanoate, and 3-(1,1,1,2,3,4,4,5,5,5 decafluoro-2-trifluoromethylpentyl) propanoate.

Useful and preferred fluoroketones having 7 to 14 carbon atoms include 3-(1,1,1,2,3,4,4,5,5,6,6,6 dodecafluoro-2-trifluoromethylhexyl) ethylketone, and 3-(1,1,1,2,3,4,4,5,5,5 decafluoro-2-trifluoromethylpentyl) propylketone.

Useful and preferred siloxanes include hexamethyldisiloxane, octamethyltrisiloxane, decamethyltetrasiloxane, dodecamethylpentasiloxane, and tetradecamethylhexasiloxane.

Preferably, the composition may comprise at most 5% by weight of wetting additives. More preferably, the composition comprises 0.01 to 3% by weight, most preferably 0.1 to 1% by weight of wetting agent.

The composition according to the present invention can be used for the preparation of organic electronic (OE) devices, for example transistors like OFETs or organic photovoltaic (OPV) devices like diodes or solar cells.

Especially preferred OE devices are OFETs. A preferred OFET according to the present invention comprises the following components:
- optionally a substrate (1),
- a gate electrode (2),
- an insulator layer comprising a dielectric material (3),
- an OSC layer (4)
- source and drain electrodes (5),
- optionally one or more protection or passivation layers (6).

FIG. 1A exemplarily and schematically depicts a typical bottom gate (BG), top contact (TC) OFET device according to the present invention, comprising a substrate (1), a gate electrode (2), a layer of dielectric material (3) (also known as gate insulator layer), an OSC layer (4), and source and drain (S/D) electrodes (5), and an optional passivation or protection layer (6).

The device of FIG. 1A can be prepared by a process comprising the steps of depositing a gate electrode (2) on a substrate (1), depositing a dielectric layer (3) on top of the gate electrode (2) and the substrate (1), depositing an OSC layer (4) on top of the dielectric layer (3), depositing S/D electrodes (5) on top of the OSC layer (4), and optionally depositing a passivation or protection layer (6) on top of the S/D electrodes (5) and the OSC layer (4).

FIG. 1B exemplarily and schematically depicts a typical bottom gate (BG), bottom contact (BC) OFET device according to the present invention, comprising a substrate (1), a gate electrode (2), a dielectric layer (3), S/D electrodes (5), an OSC layer (4), and an optional passivation or protection layer (6).

The device of FIG. 1B can be prepared by a process comprising the steps of depositing a gate electrode (2) on a substrate (1), depositing a dielectric layer (3) on top of the gate electrode (2) and the substrate (1), depositing S/D electrodes (5) on top of the dielectric layer (3), depositing an OSC layer (4) on top of the S/D electrodes (4) and the dielectric layer (3), and optionally depositing a passivation or protection layer (6) on top of the OSC layer (4).

FIG. 2 exemplarily and schematically depicts a top gate (TG) OFET device according to the present invention, comprising a substrate (1), source and drain electrodes (5), an OSC layer (4), a dielectric layer (3), and a gate electrode (2), and an optional passivation or protection layer (6).

The device of FIG. 2 can be prepared by a process comprising the steps of depositing S/D electrodes (5) on a substrate (1), depositing an OSC layer (4) on top of the S/D electrodes (4) and the substrate (1), depositing a dielectric layer (3) on top of the OSC layer (4), depositing a gate electrode (2) on top of the dielectric layer (3), and optionally depositing a passivation or protection layer (6) on top of the gate electrode (2) and the dielectric layer (3).

The passivation or protection layer (6) in the devices described in FIGS. 1A, 1B and 2 has the purpose of protecting the OSC layer and the S/D or gate electrodes from further layers or devices that may be later provided thereon, and/or from environmental influence.

The distance between the source and drain electrodes (5), as indicated by the double arrow in FIGS. 1A, 1B and 2, is the channel area.

In case of formulations for use in OPV cells, the formulation preferably comprises or contains, more preferably consists essentially of, most preferably consists exclusively of, a p-type semiconductor and a n-type semiconductor, or an acceptor and a donor material. A preferred material of this type is a blend or mixture of poly(3-substituted thiophene) or P3AT with a $C_{60}$ or $C_{70}$ fullerene or modified $C_{60}$ molecule like PCBM [(6,6)-phenyl C61-butyric acid methyl ester], as disclosed for example in WO 94/05045 A1, wherein preferably the ratio of P3AT to fullerene is from 2:1 to 1:2 by weight, more preferably from 1.2:1 to 1:1.2 by weight.

FIG. 3 and FIG. 4 exemplarily and schematically depict typical and preferred OPV devices according to the present invention [see also Waldauf et al., Appl. Phys. Lett. 89, 233517 (2006)].

An OPV device as shown in FIG. 3 preferably comprises:
- a low work function electrode (31) (for example a metal, such as aluminum), and a high work function electrode (32) (for example ITO), one of which is transparent,
- a layer (33) (also referred to as "active layer") comprising a hole transporting material and an electron transporting material, preferably selected from OSC materials, situated between the electrodes (31,32); the active layer can exist for example as a bilayer or two distinct layers or blend or mixture of p and n type semiconductor,
- an optional conducting polymer layer (34), for example comprising a blend of PEDOT:PSS (poly(3,4-ethylenedioxythiophene): poly(styrenesulfonate)), situated between the active layer (33) and the high work function electrode (32), to modify the work function of the high work function electrode to provide an ohmic contact for holes,
- an optional coating (35) (for example of LIF) on the side of the low work function electrode (31) facing the active layer (33), to provide an ohmic contact for electrons.

An inverted OPV device as shown in FIG. 4 preferably comprises:
- a low work function electrode (41) (for example a metal, such as gold), and a high work function electrode (42) (for example ITO), one of which is transparent,
- a layer (43) (also referred to as "active layer") comprising a hole transporting material and an electron transporting material, preferably selected from OSC materials, situated between the electrodes (41,42); the active layer can exist for example as a bilayer or two distinct layers or blend or mixture of p and n type semiconductor,
- an optional conducting polymer layer (44), for example comprising a blend of PEDOT:PSS, situated between the active layer (43) and the low work function electrode (41) to provide an ohmic contact for electrons,
- an optional coating (45) (for example of $TiO_x$) on the side of the high workfunction electrode (42) facing the active layer (43), to provide an ohmic contact for holes.

The hole transporting polymer is for example a polythiophene. The electron transporting material is for example an inorganic material such as zinc oxide or cadmium selenide, or an organic material such as a fullerene derivate (like for example PCBM) or a polymer (see for example Coakley, K. M. and McGehee, M. D. Chem, Mater. 2004, 16, 4533). If the bilayer is a blend an optional annealing step may be necessary to optimize device performance.

During the process of preparing an OE device, the OSC layer is deposited onto a substrate, followed by removal of the solvent together with any volatile additive(s) present, to form a film or layer.

Various substrates may be used for the fabrication of OE devices, for example glass, ITO coated glass, ITO glass with pre coated layers including PEDOT, PANI etc, or plastics, plastics materials being preferred, examples including alkyd resins, allylesters, benzocyclobutenes, butadienestyrene, cellulose, celluloseacetate, epoxide, epoxy polymers, ethylene-chlorotrifluoroethylene, ethylene-tetra-fluoroethylene, fibre glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones, and flexible films with ITO, or other conducting layers and barrier layers e.g. Vitex film.

Preferred substrate materials are polyethyleneterephthalate, polyimide, and polyethylenenaphthalate. The substrate may be any plastic material, metal or glass coated with the above materials. The substrate should preferably be homogeneous to ensure good pattern definition. The substrate may also be uniformly pre-aligned by extruding, stretching, rubbing or by photochemical techniques to induce the orientation of the organic semiconductor in order to enhance carrier mobility.

The electrodes can be deposited by liquid coating, such as spray-, dip-, web- or spin-coating, or by vacuum deposition or vapor deposition methods. Suitable electrode materials and deposition methods are known to the person skilled in the art. Suitable electrode materials include, without limitation, inorganic or organic materials, or composites of the two. Examples for suitable conductor or electrode materials include polyaniline, polypyrrole. PEDOT or doped conjugated polymers, further dispersions or pastes of graphite or particles of metal such as Au, Ag, Cu, Al, Ni or their mixtures as well as sputter coated or evaporated metals such as Cu, Cr, Pt/Pd or metal oxides such as indium tin oxide (ITO). Organometallic precursors may also be used deposited from a liquid phase.

Deposition of the OSC layer can be achieved by standard methods that are known to the skilled person and are described in the literature. Suitable and preferred deposition methods include liquid coating and printing techniques. Very preferred deposition methods include, without limitation, dip coating, spin coating, spray coating, aerosol jetting, ink jet printing, nozzle printing, letter-press printing, screen printing, gravure printing, doctor blade coating, roller printing, reverse-roller printing, offset lithography printing, flexographic printing, web printing, spray coating, dip coating, curtain coating, brush coating, slot dye coating or pad printing. Gravure, flexographic and inkjet printing are more preferred. Inkjet printing is most preferred.

According to a special aspect, an insulator layer can be deposited on a substrate in order to achieve a special type of an OE according to the present invention. Preferably, the insulator layer is deposited by solution processing, very preferably using a solution of a dielectric material, which is optionally cross-linkable, in one or more organic solvents. Preferably the solvent used for depositing the dielectric material is orthogonal to the solvent used for depositing the OSC material, and vice versa.

When spin coating is used as deposition method, the OSC or dielectric material is spun for example between 1000 and 2000 rpm for a period of for example 30 seconds to give a layer with a typical layer thickness between 0.5 and 1.5 µm. After spin coating the film can be heated at an elevated temperature to remove all residual volatile solvents.

If a cross-linkable dielectric is used, it is preferably cross-linked after deposition by exposure to electron beam or electromagnetic (actinic) radiation, like for example X-ray, UV or visible radiation. For example, actinic radiation can be used having a wavelength of from 50 nm to 700 nm, preferably from 200 to 450 nm, more preferably from 300 to 400 nm. Suitable radiation dosages are typically in the range from 25 to 3,000 mJ/cm$^2$. Suitable radiation sources include mercury, mercury/xenon, mercury/halogen and xenon lamps, argon or xenon laser sources, x-ray, or e-beam. The exposure to actinic radiation will induce a cross-linking reaction in the cross-linkable groups of the dielectric material in the exposed regions. It is also possible for example to use a light source having a wavelength outside the absorption band of the cross-linkable groups, and to add a radiation sensitive photosensitizer to the cross-linkable material.

Optionally the dielectric material layer is annealed after exposure to radiation, for example at a temperature from 70° C. to 130° C., for example for a period of from 1 to 30 minutes, preferably from 1 to 10 minutes. The annealing step at elevated temperature can be used to complete the cross-linking reaction that was induced by the exposure of the cross-linkable groups of the dielectric material to photoradiation.

After application of the inventive composition onto a substrate, a leveling step can be preferably performed. Surprising improvements can be achieved by heating and/or annealing the obtained layer comprising the solvent. Preferably, the heating and/or annealing is performed for a period of time in the range of 1 to 300 seconds, more preferably in the range of 2 to 100 seconds The temperature of the leveling step depends on the melting point of the solvent. Preferably, the temperature of the leveling step is situated in the range of 1° C. to 20° C., more preferably of 2° C. to 5° C. above the melting point of the solvent.

Removal of the solvent and any volatile additive(s) is preferably achieved by evaporation, for example by exposing the deposited layer to high temperature and/or reduced pressure, preferably at −50° C. to 200° C., more preferably 20° C. to 135° C. According to a special aspect of the present invention, the solvent(s) and any volatile additive can be evaporated under reduced pressure. Preferably, the pressure for solvent evaporation ranges from $10^{-3}$ mbar to 1 bar, more preferably from $10^{-2}$ mbar to 100 mbar and most preferably from 0.1 mbar to 10 mbar. Moreover, the evaporation of the solvent can be preferably achieved below the melting point of the solvent. Astonishing improvements can be obtained by a evaporation temperature preferably ranging from 0.1° C. to 40° C., more preferably from 1° C. to 30° C. below the melting point of the solvent.

The present composition provides an improved method for achieving multilayer OE devices, Astonishing improvements can be achieved by methods wherein at least two layers comprising organic semiconducting compounds are applied and the second layer is achieved by using a composition of the present invention.

The thickness of the OSC layer is preferably from 1 nm to 50 µm, more preferably from 2 to 1000 nm and most preferably 3 to 500 nm. Preferred layers comprising organic light emitting materials and/or charge transporting materials can have a thickness in the range of 2 to 150 nm.

Further to the materials and methods as described above and below, the OE device and its components can be prepared from standard materials and standard methods, which are known to the person skilled in the art and described in the literature.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include oligomers and dendrimers. Dendrimers are typically branched macromolecular compounds consisting of a multifunctional core group onto which further branched monomers are added in a regular way giving a tree-like structure, as described e.g. in M. Fischer and F. Vögtle, *Angew. Chem., Int. Ed.* 1999, 38, 885.

The term "conjugated polymer" means a polymer containing in its backbone (or main chain) mainly C atoms with $sp^2$-hybridisation, or optionally sp-hybridisation, which may also be replaced by hetero atoms, enabling interaction of one π-orbital with another across an intervening σ-bond. In the simplest case this is for example a backbone with alternating carbon-carbon (or carbon-hetero atom) single and multiple (e.g. double or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like arylamines, arylphosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with $sp^2$-hybridisation or sp-hybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as $n=M_n/M_U$, wherein $M_U$ is the molecular weight of the single repeating unit.

The term "small molecule" means a monomeric, i.e. a non-polymeric compound.

Unless stated otherwise, percentages of solids are percent by weight ("wt. %"), percentages or ratios of liquids (like e.g. in solvent mixtures) are percent by volume ("vol. %"), and all temperatures are given in degrees Celsius (° C.).

Unless stated otherwise, concentrations or proportions of mixture components, given in percentages or ppm are related to the entire formulation including the solvents.

The invention will now be described in more detail by reference to the following examples, which are illustrative only and do not limit the scope of the present invention.

All process steps described above and below can be carried out using known techniques and standard equipment which are described in prior art and are well-known to the skilled person.

EXAMPLES

Example 1

The substrate (2 cm² glass plates coated with PEDOT) was activated by heating for 10 minutes at 180° C. and used directly.

An OLED polymer ink was formulated by dissolving 0.5% by weight OLED polymer comprising structural units of the following formulae

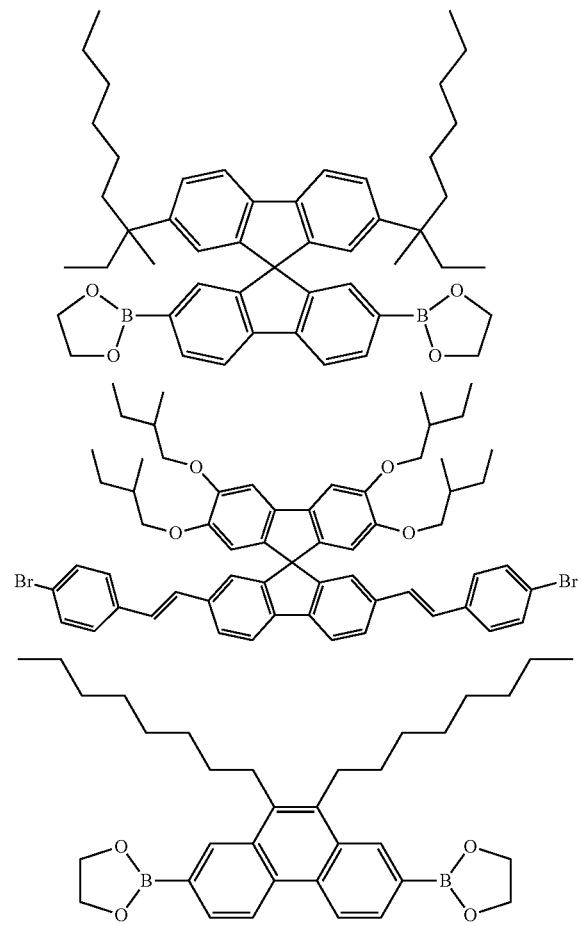

-continued

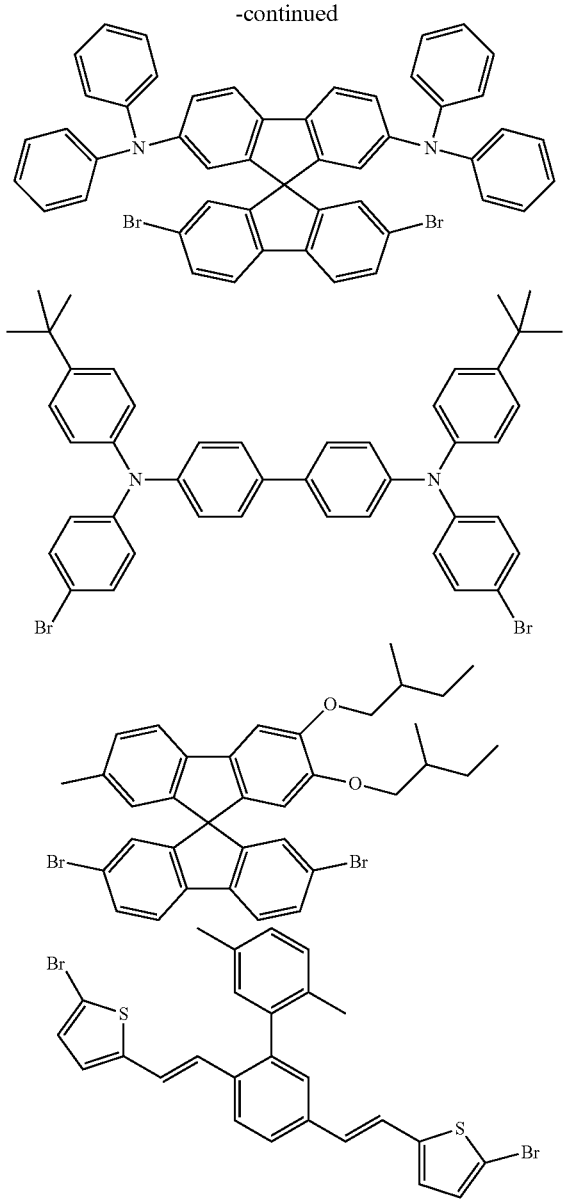

in a weight ratio of 9% to 11% to 41% to 24% to 5% to 8% to 2% in pentamethylbenzene and gave a viscosity of 3.8 cp at 60° C.

The ink was printed with the Dimatix DMP 2800 printer (print head heated to 60° C. plus heated glove) onto the substrate, 6 mm squares were printed with a drop spacing of 5, 10, 15, 20, 25, 30, 35 and 40 μm. Drop formation in the ink jet process was good as determined by visualization using a microscope illuminated by a strobe which effectively freezes the droplets in flight.

After printing the ink on the substrate, further leveling was achieved by heating and cooling the film before removal of the solvent (53° C. for about 20 seconds).

Thereafter, the solvent was removed on a hot plate at 100° C. or under vacuum at 55° C.

An excellent OLED film was formed as observed via a fluorescence method (using a Nikon Eclipse E400 microscope).

Examples 2 to 4

Example 1 was repeated. However, 1% OLED polymer as mentioned in Example 1 was dissolved in 2-methylnaphthalene, pentamethylbenzene and 1,5-dimethylnaphthalene by heating the solvent to 80° C., respectively.

The compositions were processed as described in Example 1. However, the temperature of the leveling step was about 2-5° C. above the melting point of the solvent for approximately 20 seconds and the solvent removal was performed at 100° C.

Excellent OLED films were formed as observed via a fluorescence method (using a Nikon Eclipse E400 microscope).

Example 5

Example 1 was repeated. However, 1% OLED polymer as mentioned in Example 1 was dissolved in 1,2,4,5-tetramethylbenzene by heating the solvent to 85° C.

The composition was processed as described in Example 1. However, the temperature of the leveling step was about 88° C. and the solvent removal was performed at 100° C.

An excellent OLED film was formed as observed via a fluorescence method (using a Nikon Eclipse E400 microscope).

Example 6

The substrate (2 cm² glass plates coated with PEDOT) was activated by heating for 10 minutes at 180° C. and used directly.

A printing ink was prepared by mixing a phosphorescent compound according to formula 107

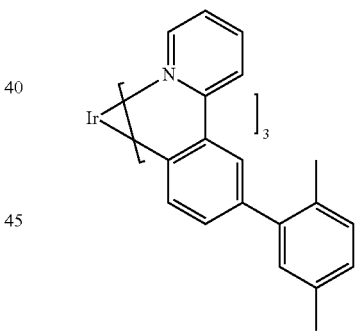

and a host material having the formula 147

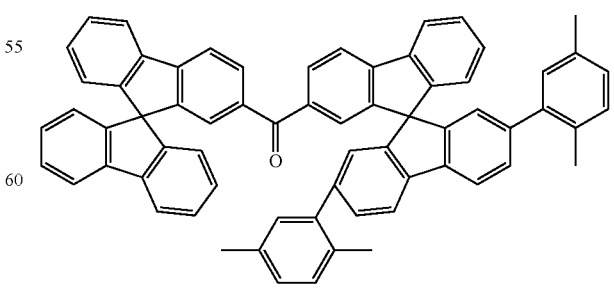

in a weight ratio of 1:4 (phosphorescent compound 107: host material 147) and dissolving the mixture obtained in pentamethylbenzene at 60° C. The concentration of both compounds in the solvent was about 1% by weight i.e. 0.2% of phosphorescent compound 107 and 0.8% of the host material 147.

The ink was printed with the Dimatix DMP 2800 printer (print head heated to 60° C. plus heated glove) onto the substrate. 6 mm squares were printed with a drop spacing of 5, 10, 15, 20, 25, 30, 35 and 40 µm. Drop formation in the ink jet process was good as determined by visualization using a microscope illuminated by a strobe which effectively freezes the droplets in flight.

After printing the ink on the substrate, further leveling was achieved by heating and cooling the film before removal of the solvent (53° C. for about 20 seconds). Thereafter, the solvent was removed on a hot plate at 100° C. or under vacuum at 55° C.

An excellent OLED film was formed as observed via a fluorescence method (using a Nikon Eclipse E400 microscope).

Example 7

Example 6 was repeated. However, glass substrates were prepared with a PEDOT layer as described above with a further layer of polymer comprising structural units of the following formulae.

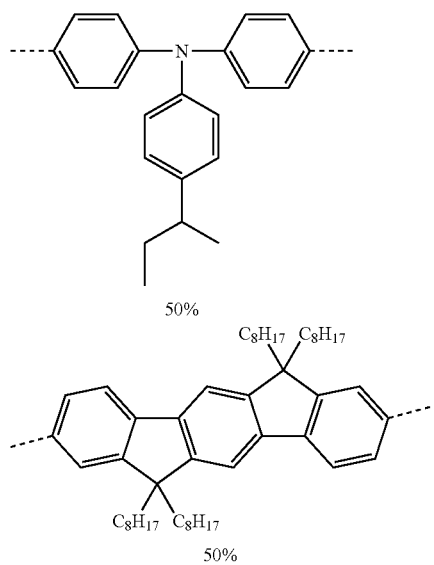

The polymer was spin coated from toluene and dried for 5 minutes at 100° C. to obtain a hole transporting layer.

The ink as described in Example 6 was then printed and dried as above and provided the level film. This demonstrated an OLED layer stack of glass, PEDOT (coated from water), hole transporting layer (coated from an organic solvent) and the SM OLED (printed from an organic solvent) where both the SM OLED and the polymer to obtain a hole transporting layer are soluble in both solvent systems.

An excellent OLED film was formed as observed via a fluorescence method (using a Nikon Eclipse E400 microscope).

Examples 8 to 17

The mixture comprising a phosphorescent compound according to formula 107 and a host material having the formula 147 as mentioned in Example 6 in a weight ratio of 1:4 have been dissolved in 2-methylnaphthalene, 1,5-dimethylnaphthalene (1,5-DMN), 5-indanol, 1,2,3,4-tetrahydro-1-naphthol, 5,6,7,8-tetrahydro-2-naphthol, 2-ethoxynaphthalene, 2-indanol, sulfolane, biphenyl and 1,2,4,5-tetramethylbenzene at elevated temperatures (typically 10° C. above the melting point of the solvent). The concentration of both compounds 107 and 147 in the solvent was about 1% by weight.

These inks have been used to achieve printed films as described in Example 6, The quality of the films was good.

Examples 18 to 21

The mixture comprising a phosphorescent compound according to formula 107 and a host material having the formula 147 as mentioned in Example 6 in a weight ratio of 1:4 have been dissolved in 1:1 biphenyl:1,5-DMN, 1:1 biphenyl:1,2,4,5-tetramethylbenzene, 2-methylnaphthalene and 2-ethoxynaphthalene at elevated temperatures (typically 10° C. above the melting point of the solvent). The concentration of both compounds 107 and 147 in the solvent was about 1% by weight.

These inks were printed on PEDOT coated glass and dried as in Example 6. However, the temperature of the leveling step was about 2-5° C. above the melting point of the solvent, and the solvent removal was performed at 100° C.

An excellent OLED film was formed as observed via a fluorescence method (using a Nikon Eclipse E400 microscope).

Example 22

Corning Eagle XG glass was washed in an ultrasonic methanol bath for 2 minutes and then rinsed with methanol. Approximately 40 nm thick silver gate electrodes were evaporated. A UV curable dielectric layer of a dielectric material Lisicon™ D207 (available from Merck KGaA) was spun on top of the OSC layer on the device and annealed at 120° C. for 1 minutes to give a dry dielectric film of approximately 1 micron thick. The dielectric layer was then crosslinked by UV curing under 365 nm wavelength late, a total UV dose of 2.6 $Jcm^{-2}$.

Approximately 40 nm thick silver source drain electrodes were evaporated with an inter-digitated geometry of 1000µ wide and 50µ long.

The electrodes were treated with a reactive washing solution Lisicon™ M001 (available from Merck KGaA) SAM treatment by spin coating from isopropyl alcohol rinsed off with isopropyl alcohol and then dried on the spin coater.

An OSC formulation was prepared by dissolving of 1.33 parts of a compound of formula M2 and 0.67 parts α-methylstyrene in pentamethylbenzene filtering the solution through a 0.45 µm PTFE cartridge filter.

In formula M2 one of $Y^1$ and $Y^2$ denotes —CH= or =CH— and the other denotes —S— and one of $Y^3$ and $Y^4$ denotes —CH= or =CH— and the other denotes —S—.

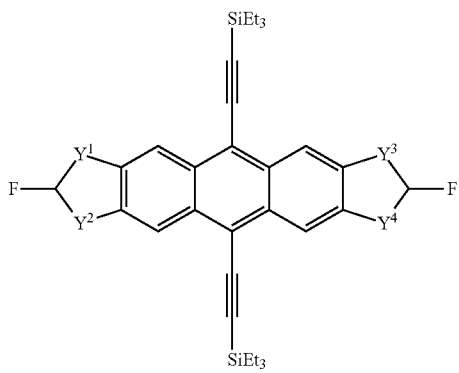

M2

The OSC formulation was then printed using a Dimatix DMP2831 ink-jet printer. The cartridge and head were heated to above the melting point of the solvent (pentamethylbenzene). Each device was individually printed over the source/drain electrodes. The resulting print was warmed to 52° C. to allow the ink to reflow, this was then placed in a bell jar with no heat and the pressure was reduced to 5 mbar and left for 20 minutes, in order to remove solvent.

Analysis of the device performance is then undertaken using an Agilent 4155C semiconductor parameter analyzer, measuring the source and drain current and gate current as a function of the gate voltage (transistor characteristics). The charge carrier mobility is calculated by known methods, as disclosed for in US 2007/0102696 A1.

The transistor characteristic and the linear and saturation mobility of the device are depicted in FIG. 5. The device has a mobility (linear 0.01 cm$^2$/Vs, saturation 0.02 cm$^2$/Vs) and good on/off ratio ($10^4$). The transistor characteristics are very good.

The data show that the ink according to the present invention can be printed using Ink-jet printing techniques, and can also generate working transistor devices that demonstrate both acceptable mobility and a good on/off ratio.

The invention claimed is:

1. A composition comprising one or more organic semiconducting compounds (OSC), including an organic phosphorescent compound that emits light and includes at least one atom having an atomic number greater than 38 and less than 84, and at least 70% by weight of one or more organic solvents, said organic solvents including an aromatic and/or heteroaromatic compound having a molecular weight of at least 120 g/mol, and a melting point of 50° C. or above and a melting point of 200° C. or less, wherein said composition is solid at a temperature of 50° C., and the boiling point of the solvent is at most 400° C.

2. The composition according to claim 1, wherein said composition comprises a surface tension in the range of 25 mN/m to 45 mN/m at 10° C. above the melting point of the one or more solvents having the highest boiling point.

3. The composition according to claim 1, wherein the one or more organic semiconducting compounds further includes a compound selected from the following formulae

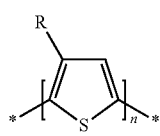

P1

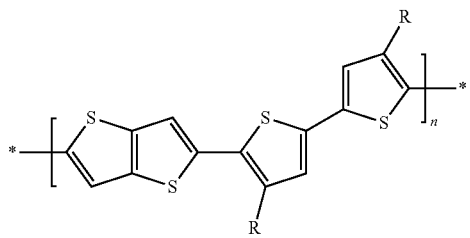

P2

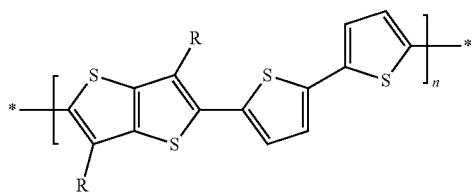

P3

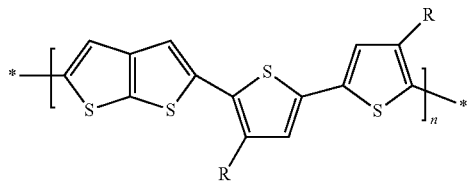

P4

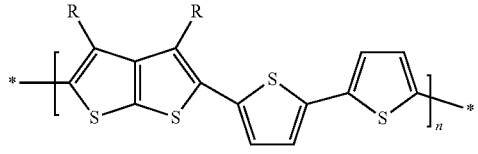

P5

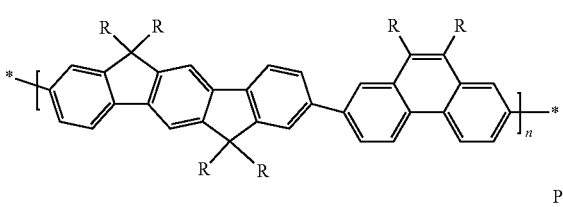

P6

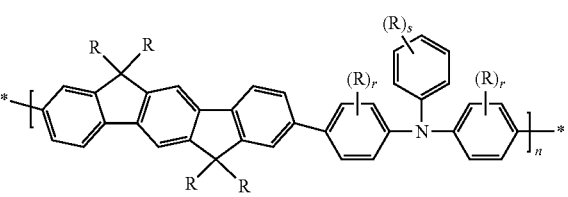

P7 wherein
n is an integer >1,
R on each occurrence identically or differently denotes H, F, Cl, Br, I, CN, a straight-chain, branched or cyclic alkyl group having from 1 to 40 C atoms, in which one or more C atoms are optionally replaced by O, S, O—CO, CO—O, O—CO—O, CR$^0$=CR$^0$ or C≡C such that O- and/or S-atoms are not linked directly to each other, and in which one or more H atoms are optionally replaced by F, Cl, Br, I or CN, or denotes an aryl or heteroaryl group having from 4 to 20 ring atoms that is unsubstituted or substituted by one or more non-aromatic groups R$^s$, and wherein one or more groups R may also form a mono- or polycyclic aliphatic or aromatic ring system with one another and/or with the ring to which they are attached, R$^s$ on each occurrence identically or differently denotes F, Cl, Br, I, CN, Sn(R$^{00}$)$_3$, Si(R$^{00}$)$_3$ or B(R$^{00}$)$_2$ a straight-chain, branched or cyclic alkyl group having from 1 to 25 C atoms, in which one or more C atoms are optionally replaced by O, S, O—CO, CO—O, O—CO—O, CR$^0$=CR$^0$, C≡C such that O- and/or S-atoms are not linked directly to each other, and in which one or more H atoms are optionally replaced by F, Cl, Br, I or CN, or R$^s$ denotes an aryl or heteroaryl group having from 4 to 20 ring atoms that is unsubstituted or substituted by one or more non-aromatic groups R$^s$, and wherein one or more groups R$^s$ may also form a ring system with one another and/or with R, R$^0$ on each occurrence identically or differently denotes H, F, Cl, CN, alkyl having from 1 to 12 C atoms or aryl or heteroaryl having from 4 to 10 ring atoms, R$^{00}$ on each occurrence identically or differently denotes H or an aliphatic or aromatic hydrocarbon group having from 1 to 20 C atoms, wherein two groups R$^{00}$ may also form a ring together with the hetero atom (Sn, Si or B) to which they are attached, r is 0, 1, 2, 3 or 4, s is 0, 1, 2, 3, 4 or 5.

4. The composition according to claim 1, wherein the one or more organic semiconducting compounds further includes a compound of the following formula

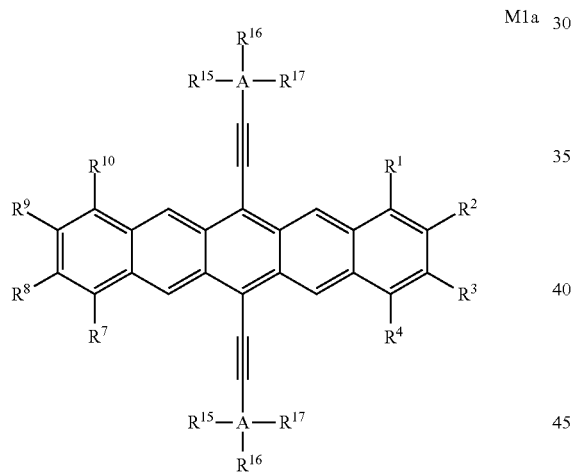

M1a wherein R$^1$, R$^2$, R$^3$, R$^4$, R$^7$, R$^8$, R$^9$, R$^{10}$, R$^{15}$, R$^{16}$, R$^{17}$ each independently are the same or different and each independently represents: H; an optionally substituted C$_1$-C$_{40}$ carbyl or hydrocarbyl group; an optionally substituted C$_1$-C$_{40}$ alkoxy group; an optionally substituted C$_6$-C$_{40}$ aryloxy group; an optionally substituted C$_7$-C$_{40}$ alkylaryloxy group; an optionally substituted C$_2$-C$_{40}$ alkoxycarbonyl group; an optionally substituted C$_7$-C$_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group; or an optionally substituted silyl group; and A represents Silicon or Germanium; and wherein independently each pair of R$^1$ and R$^2$, R$^2$ and R$^3$, R$^3$ and R$^4$, R$^7$ and R$^8$, R$^8$ and R$^9$, R$^9$ and R$^{10}$, R$^{15}$ and R$^{16}$, and R$^{16}$ and R$^{17}$ is optionally cross-bridged with each other to form a C$_4$-C$_{40}$ saturated or unsaturated ring, which saturated or unsaturated ring is optionally intervened by an oxygen atom, a sulphur atom or a group of the formula —N(R$^a$)—, wherein R$^a$ is a hydrogen atom or a hydrocarbon group, or is optionally substituted; and wherein one or more of the carbon atoms of the polyacene skeleton is optionally substituted by a heteroatom selected from the group consisting of N, P, As, O, S, Se and Te.

5. Composition according to claim 1, wherein the phosphorescent compounds are compounds of formulae (1) to (4):

formula (1)

formula (2)

formula (3)

formula (4)

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents R$^{18}$; the groups DCy and CCy are connected to one another via a covalent bond;

CCy is, identically or differently on each occurrence, a cyclic group which contains a carbon atom via which the cyclic group is bonded to the metal and which may in turn carry one or more substituents R$^{18}$;

A is, identically or differently on each occurrence, a monoanionic, bidentate chelating ligand;

R$^{18}$ are identically or differently at each instance, and are F, Cl, Br, I, NO$_2$, CN, a straight-chain, branched or cyclic alkyl or alkoxy group having from 1 to 20 carbon atoms, in which one or more nonadjacent CH$_2$ groups is optionally replaced by —O—, —S—, —NR$^{19}$—, —CONR$^{19}$—, —CO—O—, —C=O—, —CH=CH— or —C≡C— and in which one or more hydrogen atoms is optionally replaced by F, or an aryl or heteroaryl group which has from 4 to 14 carbon atoms and is optionally substituted by one or more nonaromatic R$^{18}$ radicals, and a plurality of substituents R$^{18}$, either on the same ring or on the two different rings, may together in turn form a mono- or polycyclic, aliphatic or aromatic ring system; and R$^{19}$ are identically or differently at each instance, and are a straight-chain, branched or cyclic alkyl or alkoxy group having from 1 to 20 carbon atoms, in which one or more nonadjacent CH$_2$ groups is optionally replaced by —O—, —S—, —CO—O—, —C=O—, —CH=CH— or —C≡C—, and in which one or more hydrogen atoms is optionally replaced by F, or an aryl or heteroaryl group which has from 4 to 14 carbon atoms and is optionally substituted by one or more nonaromatic $R^{18}$ radicals.

6. The composition according to claim 5, wherein A is, identically or differently on each occurrence, and is a diketonate ligand.

7. The composition according to claim 1, wherein the composition further comprises a host material.

8. The composition according to claim 1, wherein the composition further comprises at least one wetting agent.

9. The composition according to claim 1, wherein said composition is a fluid at a temperature of 150° C. with a viscosity of 0.1 to 2000 mPas.

10. The composition according to claim 9, wherein the viscosity of said composition as a fluid at a temperature of 150° C. is from 0.25 to 100 mPas.

11. The composition according to claim 1, wherein the composition is a fluid at a higher temperature with a viscosity in the range of 0.25 to 100 mPas at 10° C. above the melting point of the one or more solvents having the highest boiling point.

12. The composition according to claim 1, wherein said composition is solid at a temperature of 60° C.

13. The composition according to claim 1, wherein the organic solvent is selected from the group consisting of pentamethylbenzene, benzophenone, 5-indanol, 1,2,3-trichlorobenzene, 5,6,7,8-tetrahydro-2-naphthalene, p-bromochlorobenzene, di-isopropylnaphthalene, biphenyl, 2-indanol, 2,6-dichloronitrobenzene, 1,5-dimethylnaphthalene (1,5-DMN), 1,2,4,5-tetramethylbenzene, naphthalene, pentachlorobenzene, 1,3,5-tribromobenzene, benzoic acid, and hexamethylbenzene.

14. A coating or printing ink for the preparation of organic electronic devices which comprises the composition according to claim 1.

15. An organic electronic device prepared from the coating or printing ink according to claim 14.

16. An organic electronic device prepared from the composition according to claim 1.

17. The organic electronic device according to claim 16, wherein the device is an organic light emitting diode (OLED), an organic field effect transistor (OFET) or an organic photovoltaic (OPV) device.

18. A process of preparing an organic electronic (OE) device, comprising the steps of
a) depositing the composition according to claim 1 onto a substrate to form a film or layer,
b) removing the solvent(s).

19. A composition comprising one or more organic semiconducting compounds (OSC), including an organic phosphorescent compound that emits light and includes at least one atom having an atomic number greater than 38 and less than 84, and at least 70% by weight of one or more organic solvents, said organic solvents including an aromatic and/or heteroaromatic compound having a molecular weight of at least 120 g/mol, and a melting point of 50° C. or above and a melting point of 200° C. or less, wherein said composition is solid at a temperature of 50° C., and has a surface tension in the range of 20 mN/m to 60 mN/m, and a viscosity in the range of 1.0 to 40 mPas, at a temperature 10° C. above the melting point of the one or more solvents having the highest boiling point.

20. A coating or printing ink for the preparation of organic electronic devices which comprises the composition according to claim 19.

* * * * *